United States Patent
McLaughlin et al.

(10) Patent No.: US 9,847,221 B1
(45) Date of Patent: Dec. 19, 2017

(54) LOW TEMPERATURE FORMATION OF HIGH QUALITY SILICON OXIDE FILMS IN SEMICONDUCTOR DEVICE MANUFACTURING

(71) Applicant: Lam Research Corporation, Fremont, CA (US)

(72) Inventors: Kevin M. McLaughlin, Sherwood, OR (US); Amit Pharkya, Beaverton, OR (US); Kapu Sirish Reddy, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/280,049

(22) Filed: Sep. 29, 2016

(51) Int. Cl.
*H01L 21/31* (2006.01)
*H01L 21/3105* (2006.01)
(Continued)

(52) U.S. Cl.
CPC ...... *H01L 21/02164* (2013.01); *C23C 16/402* (2013.01); *C23C 16/56* (2013.01);
(Continued)

(58) Field of Classification Search
CPC ......... H01L 21/02164; H01L 21/02274; H01L 21/0234; H01L 21/02348; H01L 21/02129;
(Continued)

(56) References Cited

U.S. PATENT DOCUMENTS 3,704,219 A   11/1972 McDowell
3,983,385 A   9/1976 Troue
(Continued)

FOREIGN PATENT DOCUMENTS

CN   1531749 A   9/2004
CN   1624895     6/2005
(Continued)

OTHER PUBLICATIONS

U.S. Office Action dated Sep. 7, 2004 issued in U.S. Appl. No. 10/672,311.
(Continued)

*Primary Examiner* — Julio J Maldonado
*Assistant Examiner* — Molly Reida
(74) *Attorney, Agent, or Firm* — Weaver Austin Villeneuve & Sampson LLP

(57) ABSTRACT

Silicon oxide layer is deposited on a semiconductor substrate by PECVD at a temperature of less than about 200° C. and is treated with helium plasma to reduce stress of the deposited layer to an absolute value of less than about 80 MPa. Plasma treatment reduces hydrogen content in the silicon oxide layer, and leads to low stress films that can also have high density and low roughness. In some embodiments, the film is deposited on a semiconductor substrate that contains one or more temperature-sensitive layers, such as layers of organic material or spin-on dielectric that cannot withstand temperatures of greater than 250° C. In some embodiments the silicon oxide film is deposited to a thickness of between about 100-200 Å, and is used as a hardmask layer during etching of other layers on a semiconductor substrate.

20 Claims, 11 Drawing Sheets

(51) Int. Cl.
*H01L 21/316* (2006.01)
*H01L 21/02* (2006.01)
*H01L 21/027* (2006.01)
*H01L 21/308* (2006.01)
*C23C 16/40* (2006.01)
*C23C 16/56* (2006.01)

(52) U.S. Cl.
CPC ...... *H01L 21/0234* (2013.01); *H01L 21/0274* (2013.01); *H01L 21/02211* (2013.01); *H01L 21/02274* (2013.01); *H01L 21/02348* (2013.01); *H01L 21/3081* (2013.01); *H01L 21/3086* (2013.01)

(58) Field of Classification Search
CPC ........... H01L 21/02131; H01L 21/0214; H01L 21/2348; C23C 16/401; C23C 16/402; C23C 16/56
See application file for complete search history.

(56) References Cited

U.S. PATENT DOCUMENTS

| | | | |
|---|---|---|---|
| 4,313,969 A | 2/1982 | Matthews et al. |
| 4,357,451 A | 11/1982 | McDaniel |
| 4,391,663 A | 7/1983 | Hatter, III |
| 4,563,589 A | 1/1986 | Scheffer |
| 4,751,191 A | 6/1988 | Gonsiorawski et al. |
| 4,837,289 A | 6/1989 | Mueller et al. |
| 4,885,262 A | 12/1989 | Ting et al. |
| 4,927,786 A | 5/1990 | Nishida |
| 4,956,582 A | 9/1990 | Bourassa |
| 4,968,384 A | 11/1990 | Asano |
| 5,028,560 A | 7/1991 | Tsukamoto et al. |
| 5,088,003 A | 2/1992 | Sakai et al. |
| 5,174,881 A | 12/1992 | Iwasaki et al. |
| 5,178,682 A | 1/1993 | Tsukamoto et al. |
| 5,195,045 A | 3/1993 | Keane et al. |
| 5,249,076 A | 9/1993 | Fujiwara et al. |
| 5,268,320 A | 12/1993 | Holler et al. |
| 5,281,546 A | 1/1994 | Possin et al. |
| 5,282,121 A | 1/1994 | Bornhorst et al. |
| 5,288,684 A | 2/1994 | Yamazaki et al. |
| 5,298,939 A | 3/1994 | Swanson et al. |
| 5,300,331 A | 4/1994 | Schaeffer |
| 5,314,538 A | 5/1994 | Maeda et al. |
| 5,364,667 A | 11/1994 | Rhieu |
| 5,407,524 A | 4/1995 | Patrick et al. |
| 5,413,664 A | 5/1995 | Yagi et al. |
| 5,504,042 A | 4/1996 | Cho et al. |
| 5,552,927 A | 9/1996 | Wheatly et al. |
| 5,556,549 A | 9/1996 | Patrick et al. |
| 5,558,717 A | 9/1996 | Zhao et al. |
| 5,582,880 A | 12/1996 | Mochizuki et al. |
| 5,648,175 A | 7/1997 | Russell et al. |
| 5,660,895 A * | 8/1997 | Lee ....................... C23C 16/401 |
| | | | 257/E21.275 |
| 5,667,592 A | 9/1997 | Boitnott et al. |
| 5,686,054 A | 11/1997 | Barthel et al. |
| 5,700,844 A | 12/1997 | Hedrick et al. |
| 5,734,187 A | 3/1998 | Bohr et al. |
| 5,789,027 A | 8/1998 | Watkins et al. |
| 5,812,403 A | 9/1998 | Fong et al. |
| 5,840,600 A | 11/1998 | Yamazaki et al. |
| 5,849,640 A | 12/1998 | Hsia et al. |
| 5,851,715 A | 12/1998 | Barthel et al. |
| 5,858,457 A | 1/1999 | Brinker et al. |
| 5,876,798 A | 3/1999 | Vassiliev |
| 5,877,095 A | 3/1999 | Tamura et al. |
| 6,015,503 A | 1/2000 | Butterbaugh et al. |
| 6,020,035 A | 2/2000 | Gupta et al. |
| 6,090,442 A | 7/2000 | Klaus et al. |
| 6,098,637 A | 8/2000 | Parke |
| 6,132,814 A | 10/2000 | Livesay et al. |
| 6,136,680 A | 10/2000 | Lai et al. |
| 6,140,252 A | 10/2000 | Cho et al. |
| 6,150,272 A | 11/2000 | Liu et al. |
| 6,171,661 B1 | 1/2001 | Zheng et al. |
| 6,228,563 B1 | 5/2001 | Starov et al. |
| 6,232,248 B1 | 5/2001 | Shinriki et al. |
| 6,239,018 B1 | 5/2001 | Liu et al. |
| 6,254,689 B1 | 7/2001 | Meder |
| 6,268,288 B1 | 7/2001 | Hautala et al. |
| 6,270,846 B1 | 8/2001 | Brinker et al. |
| 6,271,273 B1 | 8/2001 | You et al. |
| 6,280,171 B1 | 8/2001 | Buazza |
| 6,284,050 B1 | 9/2001 | Shi et al. |
| 6,288,493 B1 | 9/2001 | Lee et al. |
| 6,290,589 B1 | 9/2001 | Tolles |
| 6,316,167 B1 | 11/2001 | Angelopoulos et al. |
| 6,329,017 B1 | 12/2001 | Liu et al. |
| 6,329,062 B1 | 12/2001 | Gaynor |
| 6,333,268 B1 | 12/2001 | Starov et al. |
| 6,340,628 B1 | 1/2002 | Van Cleemput et al. |
| 6,348,407 B1 | 2/2002 | Gupta et al. |
| 6,365,266 B1 | 4/2002 | MacDougall et al. |
| 6,367,412 B1 | 4/2002 | Ramaswamy et al. |
| 6,383,466 B1 | 5/2002 | Domansky et al. |
| 6,383,955 B1 | 5/2002 | Matsuki et al. |
| 6,386,466 B1 | 5/2002 | Ozawa et al. |
| 6,387,453 B1 | 5/2002 | Brinker et al. |
| 6,391,932 B1 | 5/2002 | Gore et al. |
| 6,392,017 B1 | 5/2002 | Chandrashekar |
| 6,394,797 B1 | 5/2002 | Sugaya et al. |
| 6,399,212 B1 | 6/2002 | Sakai et al. |
| 6,407,007 B1 | 6/2002 | Tsan et al. |
| 6,420,441 B1 | 7/2002 | Allen et al. |
| 6,444,036 B2 | 9/2002 | Chern et al. |
| 6,444,715 B1 | 9/2002 | Mukherjee et al. |
| 6,455,417 B1 | 9/2002 | Bao et al. |
| 6,467,491 B1 | 10/2002 | Sugiura et al. |
| 6,475,854 B2 | 11/2002 | Narwankar et al. |
| 6,479,374 B1 | 11/2002 | Ioka et al. |
| 6,479,409 B2 | 11/2002 | Shioya et al. |
| 6,485,599 B1 | 11/2002 | Glownia et al. |
| 6,518,130 B1 | 2/2003 | Ohno |
| 6,531,193 B2 * | 3/2003 | Fonash ................. C23C 16/402 |
| | | | 257/E21.279 |
| 6,534,395 B2 | 3/2003 | Werkhoven et al. |
| 6,548,113 B1 | 4/2003 | Birnbaum et al. |
| 6,558,755 B2 | 5/2003 | Berry et al. |
| 6,563,092 B1 | 5/2003 | Shrinivasan et al. |
| 6,566,278 B1 | 5/2003 | Harvey et al. |
| 6,568,346 B2 | 5/2003 | Pu et al. |
| 6,570,256 B2 | 5/2003 | Conti et al. |
| 6,572,252 B1 | 6/2003 | Rangarajan et al. |
| 6,576,300 B1 | 6/2003 | Berry et al. |
| 6,596,467 B2 | 7/2003 | Gallagher et al. |
| 6,596,654 B1 | 7/2003 | Bagman et al. |
| 6,635,575 B1 | 10/2003 | Xia et al. |
| 6,644,786 B1 | 11/2003 | Lebens |
| 6,677,251 B1 | 1/2004 | Lu et al. |
| 6,677,253 B2 | 1/2004 | Andideh et al. |
| 6,680,262 B2 | 1/2004 | Andideh et al. |
| 6,734,118 B2 | 5/2004 | Kloster et al. |
| 6,740,602 B1 | 5/2004 | Hendriks et al. |
| 6,740,605 B1 | 5/2004 | Shiraiwa et al. |
| 6,756,085 B2 | 6/2004 | Waldfried et al. |
| 6,759,098 B2 | 7/2004 | Han et al. |
| 6,767,836 B2 | 7/2004 | San et al. |
| 6,770,866 B2 | 8/2004 | Retschke et al. |
| 6,797,643 B2 | 9/2004 | Rocha-Alvarez et al. |
| 6,800,546 B2 | 10/2004 | Konishi et al. |
| 6,805,801 B1 | 10/2004 | Humayun et al. |
| 6,812,043 B2 | 11/2004 | Bao et al. |
| 6,821,906 B2 | 11/2004 | Wada et al. |
| 6,830,624 B2 | 12/2004 | Janakiraman et al. |
| 6,831,284 B2 | 12/2004 | Demos et al. |
| 6,835,417 B2 | 12/2004 | Saenger et al. |
| 6,848,458 B1 | 2/2005 | Shrinivasan et al. |
| 6,856,712 B2 | 2/2005 | Fauver et al. |
| 6,867,143 B1 | 3/2005 | Furukawa et al. |
| 6,875,687 B1 | 4/2005 | Weidman et al. |
| 6,884,738 B2 | 4/2005 | Asai et al. |

(56) References Cited

U.S. PATENT DOCUMENTS

| | | | |
|---|---|---|---|
| 6,890,850 B2 | 5/2005 | Lee et al. | |
| 6,899,857 B2 | 5/2005 | Pheng et al. | |
| 6,902,440 B2 | 6/2005 | Dougan et al. | |
| 6,921,727 B2 | 7/2005 | Chiang et al. | |
| 6,958,301 B2 | 10/2005 | Kim et al. | |
| 6,962,871 B2 | 11/2005 | Lee et al. | |
| 6,967,160 B1 | 11/2005 | Paton et al. | |
| 6,991,959 B2 | 1/2006 | Goundar et al. | |
| 7,005,390 B2 | 2/2006 | Ramachandrarao et al. | |
| 7,017,514 B1 | 3/2006 | Shepherd et al. | |
| 7,018,918 B2 | 3/2006 | Kloster et al. | |
| 7,025,831 B1 | 4/2006 | Butterbaugh et al. | |
| 7,030,041 B2 | 4/2006 | Li et al. | |
| 7,094,713 B1 | 8/2006 | Niu et al. | |
| 7,097,712 B1 | 8/2006 | Yamazaki et al. | |
| 7,112,541 B2 | 9/2006 | Xia et al. | |
| 7,132,334 B2 | 11/2006 | Lin | |
| 7,132,374 B2 | 11/2006 | Mak et al. | |
| 7,144,606 B2 | 12/2006 | Huang | |
| 7,148,155 B1 * | 12/2006 | Tarafdar | H01L 21/02164 257/E21.279 |
| 7,166,531 B1 | 1/2007 | Van den Hoek et al. | |
| 7,169,256 B2 | 1/2007 | Dhindsa et al. | |
| 7,176,144 B1 | 2/2007 | Wang et al. | |
| 7,195,548 B1 | 3/2007 | Hardikar et al. | |
| 7,208,389 B1 | 4/2007 | Tipton et al. | |
| 7,235,459 B2 | 6/2007 | Sandhu | |
| 7,241,704 B1 | 7/2007 | Wu et al. | |
| 7,244,672 B2 | 7/2007 | Nguyen et al. | |
| 7,247,582 B2 | 7/2007 | Stern et al. | |
| 7,253,125 B1 | 8/2007 | Bandyopadhyay et al. | |
| 7,256,111 B2 | 8/2007 | Lopatin et al. | |
| 7,264,676 B2 | 9/2007 | Lai et al. | |
| 7,265,061 B1 | 9/2007 | Cho et al. | |
| 7,304,302 B1 | 12/2007 | Nunan et al. | |
| 7,326,444 B1 | 2/2008 | Wu et al. | |
| 7,327,948 B1 | 2/2008 | Shrinivasan et al. | |
| 7,332,445 B2 | 2/2008 | Lukas et al. | |
| 7,341,761 B1 | 3/2008 | Wu et al. | |
| 7,381,659 B2 | 6/2008 | Nguyen et al. | |
| 7,381,662 B1 | 6/2008 | Niu et al. | |
| 7,390,537 B1 | 6/2008 | Wu et al. | |
| 7,394,067 B1 | 7/2008 | Soltz et al. | |
| 7,402,532 B2 | 7/2008 | Clevenger et al. | |
| 7,481,882 B2 | 1/2009 | Won et al. | |
| 7,482,265 B2 | 1/2009 | Chen et al. | |
| 7,504,663 B2 | 3/2009 | Yamazaki et al. | |
| 7,510,982 B1 | 3/2009 | Draeger et al. | |
| 7,538,012 B2 | 5/2009 | Ohmi et al. | |
| 7,611,757 B1 | 11/2009 | Bandyopadhyay et al. | |
| 7,622,162 B1 | 11/2009 | van Schravendijk et al. | |
| 7,622,400 B1 | 11/2009 | Fox et al. | |
| 7,705,431 B1 | 4/2010 | Sanganeria et al. | |
| 7,790,633 B1 | 9/2010 | Tarafdar et al. | |
| 7,851,232 B2 | 12/2010 | van Schravendijk et al. | |
| 7,858,533 B2 | 12/2010 | Liu et al. | |
| 7,906,174 B1 | 3/2011 | Wu et al. | |
| 8,043,667 B1 | 10/2011 | Bandyopadhyay et al. | |
| 8,062,983 B1 | 11/2011 | Draeger et al. | |
| 8,063,983 B2 | 11/2011 | Kotake et al. | |
| 8,137,465 B1 | 3/2012 | Shrinivasan et al. | |
| 8,178,443 B2 | 5/2012 | Rangarajan et al. | |
| 8,211,510 B1 | 7/2012 | Varadarajan et al. | |
| 8,242,028 B1 | 8/2012 | van Schravendijk et al. | |
| 8,247,332 B2 | 8/2012 | Rangarajan et al. | |
| 8,454,750 B1 | 6/2013 | Shrinivasan et al. | |
| 8,465,991 B2 | 6/2013 | Varadarajan et al. | |
| 8,512,818 B1 | 8/2013 | Varadarajan et al. | |
| 8,536,073 B2 | 9/2013 | Rangarajan et al. | |
| 8,629,068 B1 | 1/2014 | Shrinivasan et al. | |
| 8,647,993 B2 | 2/2014 | Lavoie et al. | |
| 8,715,788 B1 | 5/2014 | Bandyopadhyay et al. | |
| 8,889,233 B1 | 11/2014 | Kelman et al. | |
| 8,980,769 B2 | 3/2015 | Haverkamp et al. | |
| 9,050,623 B1 | 6/2015 | Varadarajan | |
| 9,337,068 B2 | 5/2016 | Antonelli et al. | |
| 9,659,769 B1 | 5/2017 | Varadarajan et al. | |
| 2001/0001501 A1 | 5/2001 | Lee et al. | |
| 2001/0014512 A1 | 8/2001 | Lyons et al. | |
| 2002/0001973 A1 | 1/2002 | Wu et al. | |
| 2002/0015850 A1 | 2/2002 | Nakamura et al. | |
| 2002/0016085 A1 | 2/2002 | Huang et al. | |
| 2002/0034626 A1 | 3/2002 | Liu et al. | |
| 2002/0052124 A1 | 5/2002 | Raaijmakers et al. | |
| 2002/0064341 A1 | 5/2002 | Fauver et al. | |
| 2002/0076946 A1 | 6/2002 | Kim et al. | |
| 2002/0094388 A1 * | 7/2002 | Fonash | C23C 16/402 427/579 |
| 2002/0106500 A1 | 8/2002 | Albano et al. | |
| 2002/0117109 A1 | 8/2002 | Hazelton et al. | |
| 2002/0123218 A1 | 9/2002 | Shioya et al. | |
| 2002/0123240 A1 | 9/2002 | Gallagher et al. | |
| 2002/0148563 A1 | 10/2002 | Carlson et al. | |
| 2002/0172766 A1 | 11/2002 | Laxman et al. | |
| 2002/0187627 A1 | 12/2002 | Yuang | |
| 2002/0195683 A1 | 12/2002 | Kim et al. | |
| 2003/0013280 A1 | 1/2003 | Yamanaka | |
| 2003/0015764 A1 | 1/2003 | Raaijmakers et al. | |
| 2003/0033983 A1 | 2/2003 | Song et al. | |
| 2003/0049375 A1 | 3/2003 | Nguyen et al. | |
| 2003/0064604 A1 | 4/2003 | Umeda | |
| 2003/0064607 A1 | 4/2003 | Leu et al. | |
| 2003/0068881 A1 | 4/2003 | Xia et al. | |
| 2003/0077896 A1 | 4/2003 | Saito et al. | |
| 2003/0134038 A1 | 7/2003 | Paranjpe | |
| 2003/0157248 A1 | 8/2003 | Watkins et al. | |
| 2003/0157267 A1 | 8/2003 | Waldfried et al. | |
| 2003/0199603 A1 | 10/2003 | Walker et al. | |
| 2003/0203321 A1 | 10/2003 | Ma et al. | |
| 2003/0227087 A1 | 12/2003 | Kakamu et al. | |
| 2003/0228769 A1 | 12/2003 | Chen et al. | |
| 2003/0228770 A1 | 12/2003 | Lee et al. | |
| 2004/0002617 A1 | 1/2004 | Rantala et al. | |
| 2004/0004247 A1 | 1/2004 | Forbes et al. | |
| 2004/0018319 A1 | 1/2004 | Waldfried et al. | |
| 2004/0022960 A1 | 2/2004 | Rhee et al. | |
| 2004/0023513 A1 | 2/2004 | Aoyama et al. | |
| 2004/0029391 A1 | 2/2004 | Kirkpatrick et al. | |
| 2004/0033662 A1 | 2/2004 | Lee et al. | |
| 2004/0058090 A1 | 3/2004 | Waldfried et al. | |
| 2004/0062633 A1 | 4/2004 | Rice et al. | |
| 2004/0069410 A1 | 4/2004 | Moghadam et al. | |
| 2004/0072405 A1 | 4/2004 | Yao et al. | |
| 2004/0082163 A1 | 4/2004 | Mori et al. | |
| 2004/0096593 A1 | 5/2004 | Lukas et al. | |
| 2004/0096672 A1 | 5/2004 | Lukas et al. | |
| 2004/0099915 A1 | 5/2004 | Takayama et al. | |
| 2004/0099952 A1 | 5/2004 | Goodner et al. | |
| 2004/0101633 A1 | 5/2004 | Zheng et al. | |
| 2004/0102031 A1 | 5/2004 | Kloster et al. | |
| 2004/0115933 A1 | 6/2004 | Jung et al. | |
| 2004/0151845 A1 | 8/2004 | Nguyen et al. | |
| 2004/0152239 A1 | 8/2004 | Bao et al. | |
| 2004/0161535 A1 | 8/2004 | Goundar et al. | |
| 2004/0166240 A1 | 8/2004 | Rhee et al. | |
| 2004/0175501 A1 | 9/2004 | Lukas et al. | |
| 2004/0175957 A1 | 9/2004 | Lukas et al. | |
| 2004/0178169 A1 | 9/2004 | Desphande et al. | |
| 2004/0185679 A1 | 9/2004 | Ott et al. | |
| 2004/0221871 A1 | 11/2004 | Fletcher et al. | |
| 2004/0224496 A1 | 11/2004 | Cui et al. | |
| 2004/0266214 A1 | 12/2004 | Suguro et al. | |
| 2005/0016687 A1 | 1/2005 | Shinriki et al. | |
| 2005/0025892 A1 | 2/2005 | Satoh et al. | |
| 2005/0026454 A1 | 2/2005 | Konishi et al. | |
| 2005/0032293 A1 | 2/2005 | Clark et al. | |
| 2005/0045206 A1 | 3/2005 | Smith et al. | |
| 2005/0056369 A1 | 3/2005 | Lai et al. | |
| 2005/0064712 A1 | 3/2005 | Andreas | |
| 2005/0064726 A1 | 3/2005 | Reid et al. | |
| 2005/0079717 A1 | 4/2005 | Savas et al. | |
| 2005/0095840 A1 | 5/2005 | Bhanap et al. | |
| 2005/0101154 A1 | 5/2005 | Huang | |
| 2005/0112282 A1 | 5/2005 | Gordon et al. | |

(56) References Cited

U.S. PATENT DOCUMENTS

| | | |
|---|---|---|
| 2005/0153533 A1 | 7/2005 | Hoshino et al. |
| 2005/0156285 A1 | 7/2005 | Gates et al. |
| 2005/0161821 A1 | 7/2005 | Lee et al. |
| 2005/0164497 A1 | 7/2005 | Lopatin et al. |
| 2005/0170104 A1 | 8/2005 | Jung et al. |
| 2005/0191803 A1 | 9/2005 | Matsuse et al. |
| 2005/0194619 A1 | 9/2005 | Edelstein et al. |
| 2005/0208758 A1 | 9/2005 | Lu et al. |
| 2005/0233598 A1 | 10/2005 | Jung et al. |
| 2005/0255712 A1 | 11/2005 | Kato et al. |
| 2005/0260357 A1 | 11/2005 | Olsen et al. |
| 2005/0260420 A1 | 11/2005 | Collins et al. |
| 2005/0263719 A1 | 12/2005 | Ohdaira et al. |
| 2005/0264218 A1 | 12/2005 | Dhindsa et al. |
| 2005/0272220 A1 | 12/2005 | Waldfried et al. |
| 2006/0024976 A1 | 2/2006 | Waldfried et al. |
| 2006/0027929 A1 | 2/2006 | Cooney et al. |
| 2006/0040507 A1 | 2/2006 | Mak et al. |
| 2006/0046516 A1 | 3/2006 | Weber |
| 2006/0063662 A1 | 3/2006 | Hata et al. |
| 2006/0105106 A1 | 5/2006 | Balseanu et al. |
| 2006/0110931 A1 | 5/2006 | Fukazawa et al. |
| 2006/0110936 A1 | 5/2006 | Hill et al. |
| 2006/0118817 A1 | 6/2006 | Haisma |
| 2006/0121208 A1 | 6/2006 | Siegel |
| 2006/0141806 A1 | 6/2006 | Waldfried et al. |
| 2006/0142143 A1 | 6/2006 | Abrevaya et al. |
| 2006/0145304 A1 | 7/2006 | Boyanov et al. |
| 2006/0189133 A1 | 8/2006 | Dimitrakopoulos et al. |
| 2006/0216433 A1 | 9/2006 | Fukazawa et al. |
| 2006/0216839 A1 | 9/2006 | Shemesh et al. |
| 2006/0220251 A1 | 10/2006 | Kloster |
| 2006/0246672 A1 | 11/2006 | Chen et al. |
| 2006/0260538 A1 | 11/2006 | Ye et al. |
| 2006/0265868 A1 | 11/2006 | Rueger et al. |
| 2006/0269693 A1 | 11/2006 | Balseanu et al. |
| 2007/0009673 A1 | 1/2007 | Fukazawa et al. |
| 2007/0015355 A1 | 1/2007 | Lin et al. |
| 2007/0020940 A1 | 1/2007 | Ohmi et al. |
| 2007/0032024 A1 | 2/2007 | Peidous et al. |
| 2007/0042581 A1 | 2/2007 | Sano et al. |
| 2007/0054504 A1 | 3/2007 | Chen et al. |
| 2007/0065578 A1 | 3/2007 | McDougall et al. |
| 2007/0077751 A1 | 4/2007 | Chen et al. |
| 2007/0105292 A1 | 5/2007 | Chen et al. |
| 2007/0128882 A1 | 6/2007 | Nguyen et al. |
| 2007/0132054 A1 | 6/2007 | Arghavani et al. |
| 2007/0134821 A1 | 6/2007 | Thakur et al. |
| 2007/0134907 A1 | 6/2007 | Ikeda et al. |
| 2007/0141812 A1 | 6/2007 | Zagwijn et al. |
| 2007/0161230 A1 | 7/2007 | Chen et al. |
| 2007/0189961 A1 | 8/2007 | Iacopi et al. |
| 2007/0196011 A1 | 8/2007 | Cox et al. |
| 2007/0196972 A1 | 8/2007 | Shima |
| 2007/0207624 A1 | 9/2007 | Chua |
| 2007/0215377 A1 | 9/2007 | Aoki |
| 2007/0222081 A1 | 9/2007 | Chen et al. |
| 2007/0224824 A1 | 9/2007 | Chen et al. |
| 2007/0228570 A1 | 10/2007 | Dimitrakopoulos et al. |
| 2007/0254204 A1 | 11/2007 | Shin et al. |
| 2007/0264839 A1 | 11/2007 | Van Gompel et al. |
| 2007/0275569 A1 | 11/2007 | Moghadam et al. |
| 2007/0281497 A1 | 12/2007 | Liu et al. |
| 2007/0287240 A1 | 12/2007 | Chen et al. |
| 2008/0009141 A1 | 1/2008 | Dubois et al. |
| 2008/0020591 A1 | 1/2008 | Balseanu et al. |
| 2008/0026579 A1 | 1/2008 | Lai et al. |
| 2008/0053615 A1 | 3/2008 | Sago et al. |
| 2008/0099754 A1 | 5/2008 | Enicks |
| 2008/0132055 A1 | 6/2008 | Nguyen et al. |
| 2008/0194105 A1 | 8/2008 | Dominguez et al. |
| 2008/0199977 A1 | 8/2008 | Weigel et al. |
| 2008/0242118 A1 | 10/2008 | Dimitrakopoulos et al. |
| 2008/0254643 A1 | 10/2008 | Clevenger et al. |
| 2008/0286697 A1 | 11/2008 | Verhaverbeke et al. |
| 2008/0305600 A1 | 12/2008 | Liao et al. |
| 2008/0305648 A1* | 12/2008 | Fukazawa ......... H01L 21/02211 438/792 |
| 2008/0318437 A1 | 12/2008 | Kim et al. |
| 2008/0318438 A1 | 12/2008 | Nakamura et al. |
| 2009/0017640 A1 | 1/2009 | Huh et al. |
| 2009/0039475 A1 | 2/2009 | Shioya |
| 2009/0042402 A1 | 2/2009 | Morioka |
| 2009/0059406 A1 | 3/2009 | Powers et al. |
| 2009/0207624 A1 | 8/2009 | Ma et al. |
| 2009/0243001 A1 | 10/2009 | Ramkumar et al. |
| 2009/0269507 A1 | 10/2009 | Yu et al. |
| 2009/0278116 A1 | 11/2009 | Yamate |
| 2010/0018460 A1 | 1/2010 | Singh et al. |
| 2010/0216303 A1 | 8/2010 | Ohkura |
| 2010/0261349 A1 | 10/2010 | Van Schravendijk et al. |
| 2010/0267231 A1 | 10/2010 | Van Schravendijk et al. |
| 2010/0308463 A1 | 12/2010 | Yu et al. |
| 2010/0317198 A1 | 12/2010 | Antonelli et al. |
| 2011/0045610 A1 | 2/2011 | Van Schravendijk et al. |
| 2011/0111533 A1 | 5/2011 | Varadarajan et al. |
| 2011/0117678 A1 | 5/2011 | Varadarajan et al. |
| 2011/0133313 A1 | 6/2011 | Rangarajan et al. |
| 2011/0135557 A1 | 6/2011 | Rangarajan et al. |
| 2011/0236593 A1 | 9/2011 | Okino et al. |
| 2012/0040535 A1* | 2/2012 | Wang ............... H01L 21/02126 438/778 |
| 2012/0061718 A1 | 3/2012 | Yamazaki et al. |
| 2012/0241089 A1 | 9/2012 | Dielmann et al. |
| 2012/0276752 A1 | 11/2012 | Rangarajan et al. |
| 2013/0157466 A1 | 6/2013 | Fox et al. |
| 2014/0080324 A1 | 3/2014 | Shrinivasan et al. |
| 2014/0094038 A1 | 4/2014 | Haverkamp et al. |
| 2014/0175617 A1 | 6/2014 | Antonelli et al. |
| 2015/0114292 A1 | 4/2015 | Haverkamp et al. |
| 2016/0138160 A1 | 5/2016 | Lambert et al. |

FOREIGN PATENT DOCUMENTS

| | | |
|---|---|---|
| CN | 101005023 A | 7/2007 |
| CN | 101111930 A | 1/2008 |
| CN | 101536191 A | 9/2009 |
| CN | 102074500 | 5/2011 |
| EP | 1 172 845 A2 | 1/2002 |
| EP | 1 186 685 A2 | 3/2002 |
| EP | 1 703 328 A | 9/2006 |
| JP | 62-229833 | 10/1987 |
| JP | 63-307740 | 12/1988 |
| JP | 01-107519 | 4/1989 |
| JP | 05-031735 A | 2/1993 |
| JP | 05-138658 A | 6/1993 |
| JP | 09-306892 | 11/1997 |
| JP | 11214364 A | 8/1999 |
| JP | 2001-104776 A | 4/2001 |
| JP | 2001-160547 | 6/2001 |
| JP | 2002-176100 | 6/2002 |
| JP | 2002-217189 | 8/2002 |
| JP | 2004-247725 | 9/2004 |
| JP | 2006-165573 | 6/2006 |
| JP | 2007-508691 | 4/2007 |
| JP | 2007-158000 | 6/2007 |
| JP | 2007-194582 A | 8/2007 |
| JP | 2008-529296 | 7/2008 |
| JP | 2010-103151 | 6/2010 |
| KR | 2000-0043888 | 7/2000 |
| KR | 10-2009-0121361 | 11/2009 |
| KR | 10-1201039 | 11/2012 |
| TW | 535253 B | 6/2003 |
| TW | 200405437 | 4/2004 |
| TW | 200803988 | 1/2008 |
| TW | 200839884 | 10/2008 |
| TW | 200908138 | 2/2009 |
| TW | 201130045 | 9/2011 |
| TW | 201214512 A1 | 4/2012 |
| TW | 201237959 | 9/2012 |
| TW | 201240012 A1 | 10/2012 |
| WO | WO 02/21593 | 3/2002 |
| WO | WO 03/005429 | 1/2003 |
| WO | WO 2006/104583 | 10/2006 |

(56) References Cited

FOREIGN PATENT DOCUMENTS

| WO | WO 2006/127463 | 11/2006 |
|---|---|---|
| WO | WO 2007/043206 | 4/2007 |
| WO | WO 2007/116492 | 10/2007 |
| WO | WO 2008/156680 | 12/2008 |
| WO | WO 2012/087620 | 6/2012 |

OTHER PUBLICATIONS

U.S. Office Action dated Dec. 28, 2004 issued in U.S. Appl. No. 10/672,311.
U.S. Final Office Action dated Jul. 13, 2005 issued in U.S. Appl. No. 10/672,311.
U.S. Office Action dated Dec. 20, 2005 issued in U.S. Appl. No. 10/672,311.
US Office Action (Supplemental), dated Jan. 10, 2006, issued in U.S. Appl. No. 10/672,311.
U.S. Notice of Allowance dated May 22, 2006 issued in U.S. Appl. No. 10/672,311.
U.S. Office Action dated Jun. 28, 2006 issued in U.S. Appl. No. 10/825,888.
U.S. Office Action dated Dec. 27, 2006 issued in U.S. Appl. No. 10/825,888.
U.S. Notice of Allowance dated Apr. 4, 2007 issued in U.S. Appl. No. 10/825,888.
U.S. Office Action dated Sep. 19, 2008 issued in U.S. Appl. No. 11/824,049.
U.S. Office Action dated Mar. 19, 2009 issued in U.S. Appl. No. 11/824,049.
U.S. Notice of Allowance dated Jun. 22, 2009 issued in U.S. Appl. No. 11/824,049.
U.S. Office Action dated Jan. 11, 2011 issued in U.S. Appl. No. 12/566,514.
U.S. Notice of Allowance dated Jul. 13, 2011 issued in U.S. Appl. No. 12/566,514.
U.S. Office Action dated Mar. 12, 2012 issued in U.S. Appl. No. 13/275,209.
U.S. Final Office Action dated Aug. 15, 2012 issued in Ussn 13/275,209 [NOVLP088C3].
U.S. Office Action dated Jul. 25, 2013 issued in Ussn 13/275,209 [NOVLP088C3].
U.S. Notice of Allowance dated Jan. 9, 2014 issued in Ussn 13/275,209 [NOVLP088C3].
U.S. Office Action dated Mar. 29, 2006 issued in Ussn 10/800,377 [NOVLP089].
U.S. Notice of Allowance dated Oct. 10, 2006 issued in Ussn 10/800,377 [NOVLP089].
U.S. Office Action dated Mar. 2, 2005 issued in Ussn 10/860,340 [NOVLP099].
U.S. Final Office Action dated Jun. 13, 2005 issued in U.S. Appl. No. 10/860,340.
U.S. Notice of Allowance dated Dec. 20, 2005 issued in U.S. Appl. No. 10/860,340.
U.S. Office Action dated Dec. 12, 2007 issued in U.S. Appl. No. 11/146,456.
U.S. Final Office Action dated Jul. 25, 2008 issued in U.S. Appl. No. 11/146,456.
U.S. Notice of Allowance dated Nov. 10, 2008 issued in U.S. Appl. No. 11/146,456.
U.S. Supplemental Notice of Allowance dated Dec. 15, 2008 issued in U.S. Appl. No. 11/146,456.
U.S. Office Action dated Feb. 22, 2011 issued in U.S. Appl. No. 12/369,384.
U.S. Notice of Allowance dated Aug. 19, 2011 issued in U.S. Appl. No. 12/369,384.
U.S. Office Action dated May 14, 2008 issued in U.S. Appl. No. 11/519,445.
U.S. Office Action dated Dec. 10, 2008 issued in U.S. Appl. No. 11/519,445.
U.S. Office Action dated Aug. 26, 2009 issued in U.S. Appl. No. 11/519,445.
U.S. Office Action dated Nov. 4, 2009 issued in U.S. Appl. No. 11/519,445.
U.S. Notice of Allowance dated Apr. 21, 2010 issued in U.S. Appl. No. 11/519,445.
U.S. Notice of Allowance dated May 3, 2010 issued in U.S. Appl. No. 11/519,445.
U.S. Office Action dated Dec. 30, 2008 issued in U.S. Appl. No. 10/972,084.
U.S. Office Action dated Nov. 27, 2009 issued in U.S. Appl. No. 10/972,084.
U.S. Office Action dated Oct. 15, 2010 issued in U.S. Appl. No. 10/972,084.
U.S. Final Office Action dated May 2, 2011 issued in U.S. Appl. No. 10/972,084.
U.S. Office Action dated Oct. 27, 2011 issued in U.S. Appl. No. 10/972,084.
U.S. Final Office Action dated May 1, 2012 issued in U.S. Appl. No. 10/972,084.
U.S. Office Action dated Oct. 5, 2012 issued in U.S. Appl. No. 10/972,084.
U.S. Final Office Action dated May 22, 2013 issued in U.S. Appl. No. 10/972,084.
U.S. Final Office Action dated Aug. 8, 2013 issued in U.S. Appl. No. 10/972,084.
U.S. Examiner's Answer to Appeal Brief (filed Nov. 20, 2013) Before the Patent Trial and Appeal Board on Mar. 13, 2014 issued in U.S. Appl. No. 10/972,084.
U.S. 2nd or Subsequent Examiner's Answer to Appeal Brief (filed Nov. 20, 2013) Before the Patent Trial and Appeal Board on Apr. 2, 2014 issued in U.S. Appl. No. 10/972,084.
U.S. Decision on Appeal Before the Patent Trial and Appeal Board dated Apr. 25, 2016 issued in U.S. Appl. No. 10/972,084.
U.S. Notice of Allowance dated Jul. 29, 2016 issued in U.S. Appl. No. 10/972,084.
U.S. Office Action dated Aug. 20, 2009 issued in U.S. Appl. No. 11/369,311.
U.S. Final Office Action dated Jan. 5, 2010 issued in U.S. Appl. No. 11/369,311.
U.S. Office Action dated Apr. 13, 2011 issued in U.S. Appl. No. 11/369,311.
U.S. Final Office Action dated Sep. 29, 2011 issued in U.S. Appl. No. 11/369,311.
U.S. Office Action dated Mar. 7, 2012 issued in U.S. Appl. No. 11/369,311.
U.S. Final Office Action dated Jul. 31, 2012 issued in U.S. Appl. No. 11/369,311.
U.S. Office Action dated Jun. 11, 2013 issued in U.S. Appl. No. 11/369,311.
U.S. Final Office Action dated Oct. 25, 2013 issued in U.S. Appl. No. 11/369,311.
U.S. Office Action dated Mar. 17, 2014 issued in U.S. Appl. No. 11/369,311.
U.S. Notice of Allowance dated Jul. 17, 2014 issued in U.S. Appl. No. 11/369,311.
U.S. Office Action dated Jul. 1, 2009 issued in U.S. Appl. No. 11/696,102.
U.S. Final Office Action dated Dec. 22, 2009 issued in U.S. Appl. No. 11/696,102.
U.S. Office Action dated Jan. 26, 2011 issued in U.S. Appl. No. 11/696,102.
U.S. Final Office Action dated Aug. 11, 2011 issued in U.S. Appl. No. 11/696,102.
U.S. Notice of Allowance dated Feb. 24, 2012 issued in U.S. Appl. No. 11/696,102.
U.S. Office Action dated Mar. 19, 2009 issued in U.S. Appl. No. 11/811,048.
U.S. Notice of Allowance dated Aug. 17, 2009 issued in U.S. Appl. No. 11/811,048.
U.S. Supplemental Notice of Allowance dated Oct. 8, 2009 issued in U.S. Appl. No. 11/811,048.

(56) References Cited

OTHER PUBLICATIONS

U.S. Office Action dated Aug. 20, 2009 issued in U.S. Appl. No. 11/608,056.
U.S. Final Office Action dated Mar. 23, 2010 issued in U.S. Appl. No. 11/608,056.
U.S. Notice of Allowance dated Nov. 2, 2010 issued in U.S. Appl. No. 11/608,056.
U.S. Office Action dated Jun. 11, 2009 issued in U.S. Appl. No. 11/688,695.
U.S. Final Office Action dated Dec. 31, 2009 issued in U.S. Appl. No. 11/688,695.
U.S. Office Action dated Jul. 23, 2010 issued in U.S. Appl. No. 11/688,695.
U.S. Final Office Action dated Feb. 1, 2011 issued in U.S. Appl. No. 11/688,695.
U.S. Office Action dated Dec. 14, 2011 issued in U.S. Appl. No. 11/688,695.
U.S. Final Office Action dated Jun. 21, 2012 issued in U.S. Appl. No. 11/688,695.
U.S. Notice of Allowance dated Oct. 4, 2012 issued in U.S. Appl. No. 11/688,695.
U.S. Notice of Allowance dated Feb. 14, 2013 issued in U.S. Appl. No. 11/688,695.
U.S. Office Action dated Jul. 19, 2013 issued in U.S. Appl. No. 13/886,694.
U.S. Notice of Allowance dated Sep. 12, 2013 issued in U.S. Appl. No. 13/886,694.
U.S. Office Action dated Mar. 9, 2010 issued in U.S. Appl. No. 11/977,792.
U.S. Final Office Action dated Oct. 25, 2010 issued in U.S. Appl. No. 11/977,792.
U.S. Office Action dated Jul. 6, 2011 issued in U.S. Appl. No. 11/977,792.
U.S. Final Office Action dated Oct. 24, 2011 issued in U.S. Appl. No. 11/977,792.
U.S. Office Action dated Feb. 25, 2014 issued in U.S. Appl. No. 11/977,792.
U.S. Notice of Allowance dated Oct. 8, 2014 issued in U.S. Appl. No. 11/977,792.
U.S. Notice of Allowance dated Feb. 9, 2015 issued in U.S. Appl. No. 11/977,792.
U.S. Office Action dated Nov. 30, 2016 issued in U.S. Appl. No. 14/593,046.
U.S. Final Office Action dated May 1, 2017 issued in U.S. Appl. No. 14/593,046.
U.S. Office Action dated Jul. 11, 2011 issued in U.S. Appl. No. 11/897,838.
U.S. Notice of Allowance dated Mar. 2, 2012 issued in U.S. Appl. No. 11/897,838.
U.S. Office Action, dated Jan. 3, 2013 issued in U.S. Appl. No. 13/487,051.
U.S. Notice of Allowance, dated Apr. 22, 2013, issued in U.S. Appl. No. 13/487,051.
U.S. Office Action dated Nov. 28, 2011 issued in U.S. Appl. No. 12/210,060.
U.S. Final Office Action dated Oct. 3, 2012, issued in U.S. Appl. No. 12/210,060.
U.S. Office Action dated Apr. 24, 2014 issued in U.S. Appl. No. 12/210,060.
U.S. Final Office Action dated Nov. 17, 2014, issued in U.S. Appl. No. 12/210,060.
U.S. Notice of Allowance dated Feb. 5, 2015 issued in U.S. Appl. No. 12/210,060.
U.S. Office Action dated Jul. 15, 2011 issued in U.S. Appl. No. 12/646,830.
U.S. Office Action dated Jan. 11, 2012 issued in U.S. Appl. No. 12/646,830.
U.S. Final Office Action dated May 25, 2012 issued in U.S. Appl. No. 12/646,830.
U.S. Office Action dated Mar. 6, 2013 issued in U.S. Appl. No. 12/646,830.
U.S. Final Office Action dated Jul. 30, 2013 issued in U.S. Appl. No. 12/646,830.
U.S. Office Action dated Feb. 20, 2014 issued in U.S. Appl. No. 12/646,830.
U.S. Final Office Action dated Sep. 12, 2014 issued in U.S. Appl. No. 12/646,830.
U.S. Office Action dated Sep. 3, 2015 issued in U.S. Appl. No. 12/646,830.
U.S. Final Office Action dated Feb. 2, 2016 issued in U.S. Appl. No. 12/646,830.
U.S. Office Action dated Oct. 11, 2011 issued in U.S. Appl. No. 12/973,549.
U.S. Office Action dated Jun. 7, 2012 issued in U.S. Appl. No. 12/973,549.
U.S. Office Action dated Jan. 3, 2013 issued in U.S. Appl. No. 12/973,549.
U.S. Notice of Allowance dated Feb. 22, 2013 issued in U.S. Appl. No. 12/973,549.
Chinese Office Action dated Jan. 14, 2013 issued in Application No. CN 201010539625.7.
Chinese Second Office Action dated Sep. 10, 2013 issued in Application No. CN 201010539625.7.
Chinese Third Office Action dated May 23, 2014 issued in Application No. CN 201010539625.7.
Chinese Fourth Office Action dated Mar. 24, 2015 issued in Application No. CN 201010539625.7.
Chinese Fifth Office Action dated Oct. 19, 2015 issued in Application No. CN 201010539625.7.
Chinese Sixth Office Action dated Mar. 17, 2016 issued in Application No. CN 201010539625.7.
Chinese Seventh Office Action dated Jun. 28, 2016 issued in Application No. CN 201010539625.7.
Korean Notification of Provisional Rejection dated Jul. 12, 2011 issued in Application No. KR 10-2010-0066153.
Korean Notification of Provisional Rejection dated Mar. 26, 2012 issued in Application No. KR 10-2010-0066153.
SG Examination Report dated Apr. 25, 2012 issued in Application No. SG 2010079747.
Taiwan Office Action dated Mar. 27, 2013 issued in Application No. TW 099123184.
PCT International Search Report and Written Opinion dated Dec. 26, 2012, issued in PCT/US2011/064246.
PCT International Preliminary Report on Patentability and Written Opinion dated Jul. 4, 2013, issued in PCT/US2011/064246.
Korean Office Action dated Sep. 26, 2013, issued in Application No. KR 20137019282.
Korean Second Office Action dated Dec. 5, 2013, issued in Application No. KR 2013-7019282.
Taiwan Search Report dated Aug. 20, 2013 issued in Application No. TW 100147212.
Arghavani et al., (2007) "Strain Engineering in Non-Volatile Memories," *Reed Business Information*, 6 pp.
Chaabouni, H. et at , (2007) "Sidewall restoration of porous ultra low-k dielectrics for sub-45 nm technology nodes,"*Microelectronic Engineering* 84:2595-2599.
Chaabouni, H. et al., (Sep. 2008) "Porous SiOCH Ultra Low-K recovery treatments after direct CMP process," *Advanced Metallization Conference*, 2 pp.
Cho et al., (2001) "Plasma Treatments of Molecularly Templated Nanoporous Silica Films," *Electrochemical and Solid-State Letters*, 4(4): G35-G38.
Daumont et al., (1992) "Ozone UV Spectroscopy I: Absorption Cross-Sections at Room Temperature," *Journal of Atmospheric Chemistry*, 15:145-155.
Deshmukh, et al., (Mar./Apr. 1993) "Remote Plasma Etching Reactors: Modeling and Experiment," *J. Vac. Sci. Technol.*, B 11(2):206-215.
Gangpadhyay et al., "The First International Surface Cleaning Workshop," Northeastern University, Nov. 11-14, 2002, 24 pp.

(56) References Cited

OTHER PUBLICATIONS

Ghani et al., "A 90nm High vol. Manufacturing Logic Technology Featuring Novel 45nm Gate Length Strained Silicon CMOS Transistors," *IEEE*, ©2003, 3 pp.
Huang, H. et al., "O2 Plasma Damage and Dielectric Recoveries to Patterned CDO Low-k Dielectrics," *Advanced Metallization Conference*, Sep. 2008, 6 pp.
Ityaksov, D. et al., (2008) "Deep-UV absorption and Rayleigh scattering of carbon dioxide," *Chemical Physical Letters*, 462:31-34.
Jan, C.H., et al., 90NM Generation, 300mm Wafer Low k ILD/Cu Interconnect Technology, 2003 *IEEE Interconnect Technology Conference*, 3 pp.
Lewis, R.J. Sr., Hawley's Condensed Chemical Dictionary, 12th Edition, Van Nostrad Reinhold Co., New York, 1993 (no month), excerpts pp. 916-918 & 1123-1124.
Li, Shuang et al., (Mar. 9, 2005) "Organic-functionalized pure-silica-zeolite MFI low-k films," *Chem. Mater.*, 17:1851-1854.
Malicet et al., (1995) "Ozone UV Spectroscopy. II. Absorption Cross-Sections and Temperature Dependence," *Journal of Atmospheric Chemistry*, 21:263-273.
Morin P. et al., (May 2005) "Tensile contact etch stop layer for nMOS performance enhancement: influence of the film morphology," *ECS meeting*, 6 pp.
Nagayoshi et al., (Jul. 1, 1992) "Residual Stress of a $Si_{1-x} N_x$ : H Films Prepared by Afterglow Plasma Chemical Vapor Deposition Technique," *Jpn. I Appl. Phys.*, 31:L867-L869 Part 2, No. 7A.
Rodriquez, J.A. et al., "Evolution of the mechanical stress on PECVD silicon oxide films under thermal processing," *Journal of Materials Science Letters* 19, 2000, pp. 1399-1401.
Singer, Peter "New Materials and Designs to Improve Transistor Performance," Apr. 1, 2004, *Semiconductor International*, 4 pp.
Smith, D.L et al., (1990) "Mechanism of $SiN_3$ -$SiH_4$ Llasma,"*J. Electrochem. Soc.*, 137(2):10 pp.
Takagi et al., (1997) "High Rate Deposition of a-$SiN_x$ :H by VHF PECVD", *Mat. Res. Soc. Symp. Proc. Materials Research Society*, 467:6 pp.
Takagi et al., (1998) "High Rate Deposition of a-Si:H and a-$SiN_x$ :H by VHF PECVD," *Vacuum*, 51(4): 751 -755.
van Dishoeck, et al., (Jun. 20, 2011) "Molecular photodissociation," *Modern Concepts in Laboratory Astrochemistry*, arXiv:1106.3917v1 [astro-ph.IM], 18 pp.
Varadarajan et al., "Development of High Stress SiN Films for Use with Strained Silicon Technologies," *Proc. 68th Symp. On Semiconductors and IC Tech.* Kyoto 2005, 4 pp.
Varadarajan, Bhadri N. (Aug. 21, 2003) "Tensile Silicon Nitride — P1264 NESL," *C & F Study*, 11 pp.
Venot, O. et al., (2013) "High-temperature measurements of VUV-absorption cross sections of CO2 and their application to exoplanets," *Astronomy & Astrophysics*, 551:A131.
Yu, J.J. et al., (2002) "UV Annealing of Ultrathin Tantalum Oxide Films," *Applied Surface Science*, 186:57-63.
Yung et al., (2001) "Spin-on Mesoporous Silica Films with Ultralow Dielectric Constants, Ordered Pore Structures, and Hydrophobic Surfaces," *Adv. Mater.*, 13(14):1099-1102.
US Office Action, dated Dec. 20, 2005, issued in U.S. Appl. No. 10/849,568.
US Final Office Action, dated May 31, 2006, issued in U.S. Appl. No. 10/849,568.
US Office Action, dated Oct. 18, 2006, issued in U.S. Appl. No. 10/849,568.
US Final Office Action, dated Mar. 27, 2007, issued in U.S. Appl. No. 10/849,568.
US Office Action, dated Jun. 22, 2007, issued in U.S. Appl. No. 10/849,568.
US Office Action, dated Dec. 18, 2007, issued in U.S. Appl. No. 10/849,568.
US Final Office Action, dated Sep. 25, 2008, issued in U.S. Appl. No. 10/849,568.
US Office Action, dated Jan. 22, 2009, issued in U.S. Appl. No. 10/849,568.
US Notice of Allowance, dated Jul. 10, 2009, issued in U.S. Appl. No. 10/849,568.
US Office Action, dated May 22, 2007, issued in U.S. Appl. No. 11/376,510.
US Notice of Allowance, dated Sep. 27, 2007, issued in U.S. Appl. No. 11/376,510.
US Supplemental Notice of Allowance, dated May 1, 2008, issued in U.S. Appl. No. 11/376,510.
US Office Action, dated Dec. 12, 2008, issued in U.S. Appl. No. 11/369,658.
US Office Action, dated Jul. 8, 2009, issued in U.S. Appl. No. 11/369,658.
US Final Office Action, dated Mar. 18, 2010, issued in U.S. Appl. No. 11/369,658.
US Office Action, dated Aug. 28, 2009, issued in U.S. Appl. No. 11/639,661.
US Office Action, dated Feb. 24, 2010, issued in U.S. Appl. No. 11/639,661.
US Final Office Action, dated Nov. 5, 2010, issued in U.S. Appl. No. 11/693,661.
US Notice of Allowance, dated Apr. 10, 2012, issued in U.S. Appl. No. 12/631,691.
US Notice of Allowance, dated Jan. 24, 2012, issued in U.S. Appl. No. 12/631,709.
US Notice of Allowance, dated May 15, 2013, issued in U.S. Appl. No. 13/546,937.
US Office Action dated Sep. 29, 2015 issued in U.S. Appl. No. 14/105,026.
US Notice of Allowance dated Jan. 29, 2016 issued in U.S. Appl. No. 14/105,026.
Chinese First Office Action dated Jan. 24, 2014 issued in Application No. 201010569747.0.
Chinese Second Office Action dated Aug. 14, 2014 issued in CN Application No. 201010569747.0.
Chinese Third Office Action dated Jan. 13, 2015 issued in CN Application No. 201010569747.0.
Japanese Office Action dated Jul. 29, 2014 issued in Application No. 2010-256165.
Korean Office Action dated Feb. 20, 2017 issued in Application No. KR 10-2010-0123145.
Taiwan Notice of Allowance and Search Report dated Jul. 8, 2015 issued in Application No. TW 099140866.
Taiwan Office Action dated Jan. 14, 2016 issued in Application No. TW 104126278.
Taiwan Examination Report dated Mar. 14, 2017 issued in Application No. TW 102146997.
Hoffman et al., (May/Jun. 1995) "Plasma-enhanced Chemical Vapor Deposition of Silicon, Germanium, and Tin Nitride Thin Films from Metalorganic Precursors", *J. Vac. Sci. Technol.A* 13(3):820-824.
International Sematech Ultra Low-K Workshop. (2002) p. 1.
Szekeres, A. et al. (2006) "Plasma-assisted chemical vapor deposited silicon oxynitride as an alternative material for gate dielectric in MOS devices," *Microelectronics Journal 37*, pp. 64-70.
Wang et al. (2003) "Reduction of Oxygen Plasma Damage by Postdeposition Helium Plasma Treatment for Carbon-Doped Silicon Oxide Low Dielectric Constant Films," *Electrochemical and Solid-State Letters*, 6 (1) F1-F3.
U.S. Appl. No. 10/056,926, dated Jan. 24, 2002, Gaynor.
U.S. Appl. No. 10/295,965, dated Nov. 15, 2002, Schulberg et al.
U.S. Appl. No. 10/301,013, dated Nov. 21, 2002, Watkins et al.
U.S. Appl. No. 11/656,661, dated Jan. 22, 2007, Cho et al.
U.S. Appl. No. 10/807,680, dated Mar. 23, 2004, Wu et al.
U.S. Appl. No. 10/982,654, dated Nov. 5, 2004, Cho et al.
U.S. Appl. No. 12/840,192, dated Jul. 20, 2010, Tarafdar et al.
U.S. Appl. No. 10/972,084, dated Oct. 22, 2004, Varadarajan et al.
U.S. Appl. No. 11/561,834, dated Nov. 20, 2006, Kamian et al.
U.S. Appl. No. 11/622,409, dated Jan. 11, 2007, Shaviv et al.
U.S. Appl. No. 11/622,423, dated Jan. 11, 2007, Schravendijk.
U.S. Appl. No. 14/086,732, dated Nov. 21, 2013, Shrinivassan et al.
U.S. Appl. No. 11/731,581, dated Mar. 30, 2007, Haverkamp et al.
U.S. Appl. No. 12/172,089, dated Jul. 11, 2008, Wu et al.

(56) References Cited

OTHER PUBLICATIONS

U.S. Appl. No. 11/975,473, dated Oct. 18, 2007, Varadarajan et al.
U.S. Appl. No. 11/899,683, dated Sep. 7, 2007, Jiang et al.
U.S. Appl. No. 12/210,060, dated Sep. 12, 2008, Haverkamp et al.
U.S. Appl. No. 11/369,658, dated Mar. 6, 2006, Wu et al.
U.S. Appl. No. 11/693,661, dated Mar. 29, 2007, Wu et al.
U.S. Office Action dated Jan. 22, 2010 issued in U.S. Appl. No. 11/656,661.
U.S. Final Office Action dated Aug. 24, 2010 issued in U.S. Appl. No. 11/656,661.
U.S. Office Action dated May 19, 2011 issued in U.S. Appl. No. 11/656,661.
U.S. Final Office Action dated Nov. 10, 2011 issued in U.S. Appl. No. 11/656,661.
U.S. Office Action dated Jul. 19, 2012 issued in U.S. Appl. No. 11/656,661.
U.S. Final Office Action dated Jan. 30, 2013 issued in U.S. Appl. No. 11/656,661.
U.S. Office Action dated Nov. 28, 2007 issued in U.S. Appl. No. 10/807,680.
U.S. Final Office Action dated Jul. 10, 2008 issued in U.S. Appl. No. 10/807,680.
U.S. Office Action dated Apr. 3, 2008 issued in U.S. Appl. No. 10/982,654.
U.S. Final Office Action dated Jul. 9, 2008 issued in U.S. Appl. No. 10/982,654.
U.S. Office Action dated Dec. 4, 2008 issued in U.S. Appl. No. 10/982,654.
U.S. Office Action dated Feb. 6, 2012 issued in U.S. Appl. No. 12/840,192.
U.S. Final Office Action dated Jul. 19, 2012 issued in U.S. Appl. No. 12/840,192.
U.S. Notice of Allowance dated Sep. 20, 2012 issued in U.S. Appl. No. 12/840,192.
U.S. Office Action dated Mar. 15, 2013 issued in U.S. Appl. No. 12/840,192 .
U.S. Office Action dated May 21, 2010 issued in U.S. Appl. No. 11/561,834.
U.S. Final Office Action dated Dec. 3, 2010 issued in U.S. Appl. No. 11/561,834.
U.S. Office Action dated Jul. 1, 2009 issued in U.S. Appl. No. 11/622,409.
U.S. Final Office Action dated Nov. 5, 2009 issued in U.S. Appl. No. 11/622,409.
U.S. Office Action dated Jan. 10, 2008 issued in U.S. Appl. No. 11/622,423.
U.S. Final Office Action dated Jul. 23, 2008 issued in U.S. Appl. No. 11/622,423.
U.S. Office Action dated Dec. 13, 2011 issued in U.S. Appl. No. 12/940,324.
U.S. Office Action dated Jun. 18, 2015 issued in U.S. Appl. No. 14/086,732.
U.S. Final Office Action dated Nov. 20, 2015 issued in U.S. Appl. No. 14/086,732.
U.S. Office Action dated Jun. 1, 2009 issued in U.S. Appl. No. 11/731,581.
U.S. Office Action dated Feb. 4, 2010 issued in U.S. Appl. No. 11/731,581.
U.S. Final Office Action dated Sep. 2, 2010 issued in U.S. Appl. No. 11/731,581.
U.S. Final Office Action dated Jun. 2, 2011 issued in U.S. Appl. No. 11/731,581.
U.S. Office Action dated Nov. 28, 2011 issued in U.S. Appl. No. 11/731,581.
U.S. Office Action dated Aug. 28, 2012 issued in U.S. Appl. No. 11/731,581.
U.S. Final Office Action dated Jun. 14, 2013 issued in U.S. Appl. No. 11/731,581.
U.S. Office Action dated Mar. 31, 2014 issued in U.S. Appl. No. 14/026,894.
U.S. Final Office Action dated Dec. 5, 2014 issued in U.S. Appl. No. 14/026,894.
U.S. Office Action dated May 31, 2012 issued in U.S. Appl. No. 12/726,263.
U.S. Final Office Action dated Sep. 10, 2012 issued in U.S. Appl. No. 12/726,263.
U.S. Office Action dated Mar. 6, 2013, issued in U.S. Appl. No. 12/726,263.
U.S. Final Office Action, dated Aug. 7, 2013, issued in U.S. Appl. No. 12/726,263.
U.S. Office Action dated Sep. 13, 2010 issued in U.S. Appl. No. 12/172,089.
U.S. Final Office Action dated Apr. 14, 2011 issued in U.S. Appl. No. 12/172,089.
U.S. Office Action dated Oct. 28, 2008 issued in U.S. Appl. No. 11/975,473.
U.S. Final Office Action dated Mar. 23, 2009 issued in U.S. Appl. No. 11/975,473.
U.S. Office Action dated Oct. 9, 2009 issued in U.S. Appl. No. 11/975,473.
U.S. Final Office Action dated Mar. 25, 2010 issued in U.S. Appl. No. 11/975,473.
U.S. Office Action dated Nov. 1, 2010 issued in U.S. Appl. No. 11/975,473.
U.S. Office Action dated May 29, 2009 issued in U.S. Appl. No. 11/899,683.
U.S. Final Office Action dated Feb. 8, 2010 issued in U.S. Appl. No. 11/899,683.
U.S. Office Action dated Mar. 24, 2016 issued in U.S. Appl. No. 14/546,990.
U.S. Final Office Action dated Sep. 9, 2016 issued in U.S. Appl. No. 14/546,990.
U.S. Notice of Allowance dated Sep. 7, 2017 issued in U.S. Appl. No. 14/593,046.
Taiwan Examination Report dated Aug. 8, 2017 issued in Application No. TW 102146997.

* cited by examiner

LOW TEMPERATURE FORMATION OF HIGH QUALITY SILICON OXIDE FILMS IN SEMICONDUCTOR DEVICE MANUFACTURING

FIELD OF THE INVENTION

The present invention pertains to methods of forming layers of material on a semiconductor substrate. Specifically, the invention pertains to methods for forming silicon oxide layers by plasma-enhanced chemical vapor deposition (PECVD).

BACKGROUND OF THE INVENTION

Fabrication of semiconductor devices typically involves deposition and patterning of several layers of different materials. When several layers are deposited in a stack, stress characteristics of deposited layers become particularly important because highly stressed materials can lead to disruption in alignment of layers in a stack, buckling, delamination, and, ultimately, to patterning inaccuracy, and semiconductor device failure.

Most film deposition is associated with the introduction of residual stress in the deposited film due to both extrinsic factors (e.g., thermal expansion coefficient mismatch) and/or intrinsic factors (e.g., defects and/or dislocations within lattice). The stress can be either compressive or tensile depending, for instance, on the characteristics of the substrate, the type of film being deposited, its properties, the manner of its deposition, etc. Compressive stress in the deposited films can lead to blistering or buckling of the film whereas tensile stress may lead to film cracking. Additionally, the wafer distortion induced by these stresses can cause reliability issue in other device layers and, generally, adversely impact electrical and optical performance, as well as the mechanical integrity of the fabricated semiconductor device. Thus, in semiconductor device fabrication, film stress is a major concern of the device layer integration strategy.

SUMMARY OF THE INVENTION

Silicon oxide is widely used in semiconductor device manufacturing as a dielectric layer material, and is often deposited by plasma-enhanced chemical vapor deposition processes (PECVD). There is currently a need to deposit silicon oxide by PECVD at low temperature because many integration schemes involve substrates having layers of temperature-sensitive materials (e.g., organic dielectrics) that cannot withstand high temperature PECVD. However, conventional low temperature PECVD provides silicon oxide films having unacceptably high stress values. In addition, silicon oxide PECVD films deposited at low temperature are found to have high hydrogen content and relatively low density, which makes them less attractive for use as hardmasks.

It was unexpectedly discovered that plasma treatment, and, particularly, helium plasma treatment of silicon oxide films obtained by low temperature PECVD, modifies the films and is capable of reducing film stress to less than about 80 MPa in absolute value. Further, the plasma treatment increases density of the formed films such that low stress films with densities of at least 2.05 g/cm$^3$, and at least 2.1 g/cm$^3$ can be obtained.

In one aspect, a method for processing a semiconductor substrate is provided, wherein the method includes: (a) providing a semiconductor substrate to a PECVD process chamber; (b) depositing a layer of silicon oxide on the semiconductor substrate by PECVD at a temperature of less than about 200° C. (e.g., at a temperature of less than about 180° C.), wherein the depositing comprises flowing a silicon-containing precursor, an oxygen-containing reactant, and, optionally, an inert gas, such as helium, into the PECVD process chamber and forming a plasma; (c) stopping flow of the silicon-containing precursor after deposition; and (d) treating the deposited layer of silicon oxide with a plasma at a temperature of less than about 200° C. to thereby modify the deposited layer and to reduce the stress of the deposited layer to an absolute value of less than about 80 MPa. Silicon oxide films having stress of less than about 50 MPa and even less than about 10 MPa in absolute value can be obtained. In one example the deposition of the silicon oxide layer is performed by forming a plasma in a mixture of SiH$_4$ (silicon-containing precursor), CO$_2$ (oxygen-containing reactant), and helium (an inert gas) at a pressure of between about 1.5-5 torr. In some embodiments the method involves increasing power used for plasma generation from a first power level used in the deposition of the silicon oxide layer to a second, greater power level used in plasma treatment of the deposited layer. The plasma treatment step is performed, in some embodiments, in a process gas consisting essentially of helium. The plasma treatment step can be performed at the same pressure as the deposition step, or at a different pressure. In one example, the plasma treatment step is performed in the same process chamber and at substantially the same pressure and temperature as the deposition step. In some embodiments the plasma is not extinguished after deposition of the silicon oxide layer and before stopping the flow of the silicon-containing precursor into the process chamber. Further, the process may include purging the process chamber to remove the silicon-containing precursor from the process chamber after the deposition of the silicon oxide and before plasma treatment.

Advantageously, the process can be performed on a substrate containing one or more layers of temperature-sensitive materials. For example, in some embodiments the deposition and plasma treatment of low-stress silicon oxide is performed on a semiconductor substrate having one or more layers of temperature-sensitive material that is sensitive to temperatures of 250° C. and higher. Examples of temperature-sensitive materials include organic materials and spin-on dielectrics.

The plasma treatment of the layer of silicon oxide reduces the content of hydrogen in the layer of silicon oxide. In some embodiments the silicon oxide obtained after plasma treatment does not have a Si—H peak at 2200-2300 cm$^{-1}$ on an IR spectrum.

The described process can be implemented in a single-station or in a multi-station apparatus. In one embodiment, the method includes depositing and plasma treating a portion of the silicon oxide at a first station of a multi-station PECVD apparatus, transferring the substrate to a second station of the multi-station PECVD apparatus, and repeating depositing and plasma treating another portion of the silicon oxide in the second station of the multi-station PECVD apparatus.

The methods provided herein can be integrated with the patterning methods. In some embodiments, the processes described herein further include applying photoresist to the semiconductor substrate; exposing the photoresist to light; patterning the photoresist and transferring the pattern to the semiconductor substrate; and selectively removing the photoresist from the semiconductor substrate.

In another aspect, a method for processing a semiconductor substrate involving UV treatment is provided. The method includes: (a) providing a semiconductor substrate to a PECVD process chamber; (b) depositing a layer of silicon oxide on the semiconductor substrate by PECVD at a temperature of less than about 200° C.; (c) stopping flow of the silicon-containing precursor after deposition; and (d) treating the deposited layer of silicon oxide with UV light having a wavelength of 180 nm or less at a temperature of less than about 200° C. to modify the deposited layer and to reduce the stress of the deposited layer to an absolute value of less than about 80 MPa.

According to another aspect, an apparatus for deposition and plasma treatment of silicon oxide films is provided. The apparatus includes a PECVD process chamber, a generator configured for forming a plasma in the PECVD process chamber, and a controller. The PECVD process chamber includes a substrate support for holding the substrate in place during deposition, and one or more inlets for introducing reactants into the process chamber. The controller includes program instructions for conducting any of the deposition and plasma treatment methods provided herein.

According to another aspect, an apparatus for deposition and UV treatment of silicon oxide films is provided. The apparatus includes a PECVD process chamber, a generator configured for generating UV radiation having a wavelength of 180 nm or less in the PECVD process chamber or in a different process chamber that is dedicated for UV treatment, and a controller. The PECVD process chamber includes a substrate support for holding the substrate in place during deposition, and one or more inlets for introducing reactants into the process chamber. The controller includes program instructions for conducting any of the deposition and UV treatment methods provided herein.

According to another aspect, a system is provided herein which includes any of the apparatuses described herein and a stepper.

According to another aspect, a non-transitory computer machine-readable medium is provided, which includes program instructions for control of any of the apparatuses provided herein. The instructions include code for any of deposition and treatment methods provided herein.

These and other features and advantages of the present invention will be described in more detail below with reference to the associated drawings.

DETAILED DESCRIPTION

Introduction and Overview

Figure 1A:
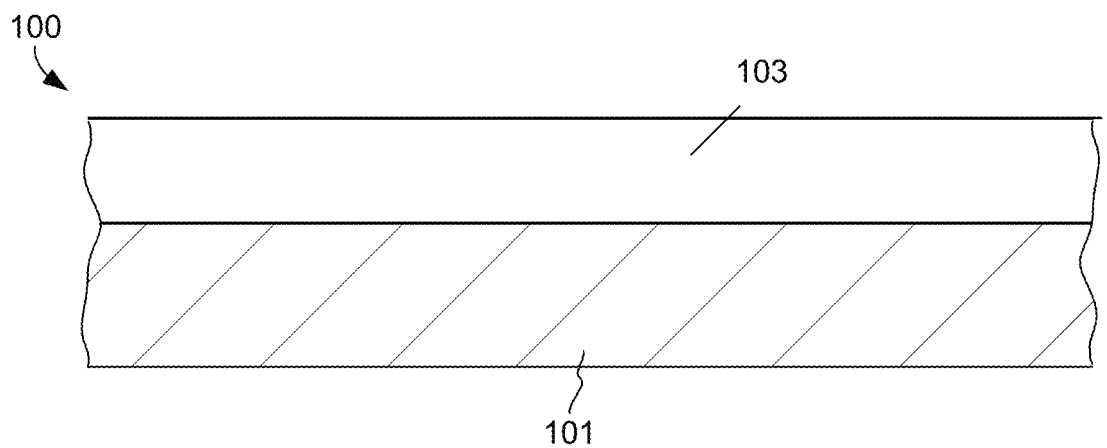
FIGS. 1A-1B show schematic cross sectional depictions of an exemplary semiconductor device that undergoes processing using methods provided herein.

Formation of high quality silicon oxide at low temperature is accomplished by depositing a silicon oxide layer by PECVD on a semiconductor substrate at a low temperature, followed by treating the deposited layer with plasma and/or UV radiation having a wavelength of less than about 180 nm to reduce the stress of deposited layer to an absolute value of less than about 80 MPa.

The terms "semiconductor substrate" and "semiconductor wafer" refer to substrates that contain semiconductor material anywhere on the substrate, and may contain layers of other materials, such as conductors and dielectrics.

The term "silicon oxide" refers to a material that is composed of silicon, oxygen, and, optionally, hydrogen. Other elements, such as carbon, nitrogen, boron and fluorine may be also present as dopants in small concentration (e.g., up to about 10% atomic excluding hydrogen). "High quality silicon oxide" refers to silicon oxide having one or any combination of the following characteristics: stress of less than about 80 MPa in absolute value; density of greater than about 2.05 g/cm3; and refractive index (RI) of less than about 1.47. In some embodiments, the high quality silicon oxide films provided herein have all of the characteristics listed above.

The term "low temperature formation" or "low temperature deposition" refers to formation of films at a temperature of less than about 200° C. In some embodiments, low temperature films are formed at a temperature of between about 100-180° C., such as between about 150-180° C.

The term "PECVD", as used herein refers to a deposition method that involves reacting one or more molecules with plasma assistance primarily in bulk. This method is distinct from atomic layer deposition (ALD), where the reaction occurs primarily on the surface of the substrate and reactions in the bulk of the process chamber are suppressed. The term "PECVD process chamber" or "PECVD apparatus" as used herein refers to any process chamber or apparatus that is capable of conducting reactions in PECVD mode.

In general, low temperature methods of forming high-quality silicon oxide films provided herein can be used in a variety of applications, such as in logic device fabrication, in fabrication of memory devices, complementary metal-oxide-semiconductor (CMOS) image sensor devices, etc. These methods are particularly useful for applications in which several layers of material (including one or more layers of high-quality silicon oxide provided herein) are deposited in a stack on a substrate, followed by patterning of one or more layers of the stack. In some embodiments high-quality silicon oxide is deposited as part of a planar stack of at least 3 layers, of at least 5 layers, or of at least 10 layers. The combination of low stress (less than about 80 MPa, preferably less than about 50 MPa in absolute value) and low roughness (RI of less than about 1.47) is particularly advantageous for these stacking applications, since stack distortion effects would be minimized, and patterning can be performed with high precision.

In some embodiments the high-quality silicon oxide provided herein is used as a hardmask or an etch stop layer. In these embodiments, the high-quality silicon oxide is also characterized by high density (at least about 2.05 $g/cm^3$, such as at least about 2.1 $g/cm^3$, or such as at least about 2.15 $g/cm^3$) in addition to low stress. Density correlates with etch selectivity, with denser materials being more resistant to etching than materials of lower density, and, therefore, high density is a particularly desirable characteristic for hardmask and etch stop applications. Hardmask layers protect the layers that lie directly underneath the hardmask from being etched, while unprotected material is etched to form recessed features. In some embodiments the high-quality silicon oxide provided herein is used as an etch stop layer. For example it can serve as an etch stop layer during etching of SiOC material that lies directly above it.

In some embodiments, the high-quality silicon oxide hardmask is deposited over a first layer (e.g., a layer of ULK dielectric), the hardmask is patterned, such that the hardmask material is removed in selected locations, exposing the first layer, and the exposed first layer is etched in the presence of the exposed hardmask. For example, a low density SiOC can be etched in a presence of exposed hardmask with a fluorine-based chemistry (e.g., using $CH_2F_2$).

Formation of silicon oxide films at low temperature is particularly desirable for substrates containing temperature-sensitive materials that can structurally or functionally deteriorate at high temperatures. In some embodiments the substrate provided for deposition of high-quality silicon oxide contains one or more layers of temperature-sensitive materials. In some embodiments this material or materials start deteriorating at 200° C. and higher, or 250° C. and higher, or 275° C. and higher. Therefore, all manipulations with these substrates should be performed at lower temperatures in order to avoid undesired deterioration of these temperature-sensitive layers. Examples of temperature-sensitive materials include organic dielectrics (which are typically deposited by spin-on methods), such as polyimide, polynorbornenes, and benzocyclubutene-based polymers.

FIG. 1A illustrates a cross-sectional schematic view of an example of a semiconductor substrate 100 before formation of a high-quality silicon oxide layer. The substrate contains a layer of ultra low-k (ULK) dielectric 101, where the ULK dielectric has a dielectric constant of about 2.2 or less. The ULK dielectric can be deposited by CVD, PECVD, or a spin-on method on an underlying layer (not shown). In some embodiments the ULK dielectric is a porous dielectric that includes silicon and oxygen. The ULK layer may reside over an underlying metallization layer that may include another layer of ULK dielectric having embedded metal lines. Layer 103 resides over and in contact with the ULK dielectric layer 103, and in the illustrated embodiment is a temperature-sensitive layer containing organic spin-on dielectric that is susceptible to degradation at temperatures that are used in conventional PECVD (e.g., at 250° C. and higher or 300° C. and higher).

Figure 1B:
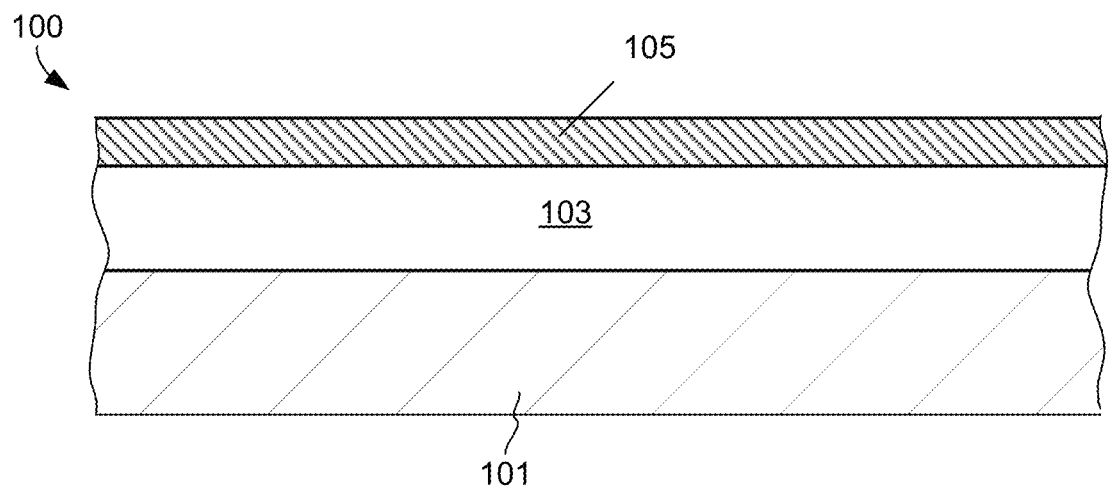

FIG. 1B illustrates a cross-sectional schematic view of the semiconductor substrate 100 after deposition of the high-quality silicon oxide hardmask 105. The hardmask 105 is formed using low-temperature methods provided herein over and in contact with the spin-on dielectric layer 103. In some embodiments, the thickness of the formed hardmask is between about 100-200 Å. After formation of the hardmask layer 105 one or more planar layers may be deposited over the hardmask layer 105, forming a stack of at least 3, or at least 5 layers. In some embodiments, one of these overlying layers is a photoresist layer, which is then patterned, and the pattern is transferred to the hardmask layer 105 using photolithographic techniques. The patterning can remove portions of high-quality silicon oxide material in selected locations, exposing the underlying layer 103. Then, exposed layer 103 (and subsequently exposed ULK dielectric layer 101) can be etched in a presence of exposed hardmask 105. In some embodiments, the semiconductor processing methods include etching a layer of material that underlies or overlies the layer of high quality silicon oxide, in the presence of exposed silicon oxide, where the silicon oxide serves as a hardmask or an etch stop layer.

Prior to development of methods provided herein, formation of low-stress silicon oxide at low temperature using PECVD presented an unsolved problem, because it was not possible to lower the stress of PECVD films to less than 120 MPa in absolute value using variation of PECVD parameters, such as pressure, process gas composition, and power used in plasma generation. Films with stresses in excess of 100 MPa have limited utility, particularly in applications that involve patterning, and therefore new PECVD-based methods for producing high quality silicon oxide at low temperature were needed.

Figure 2:
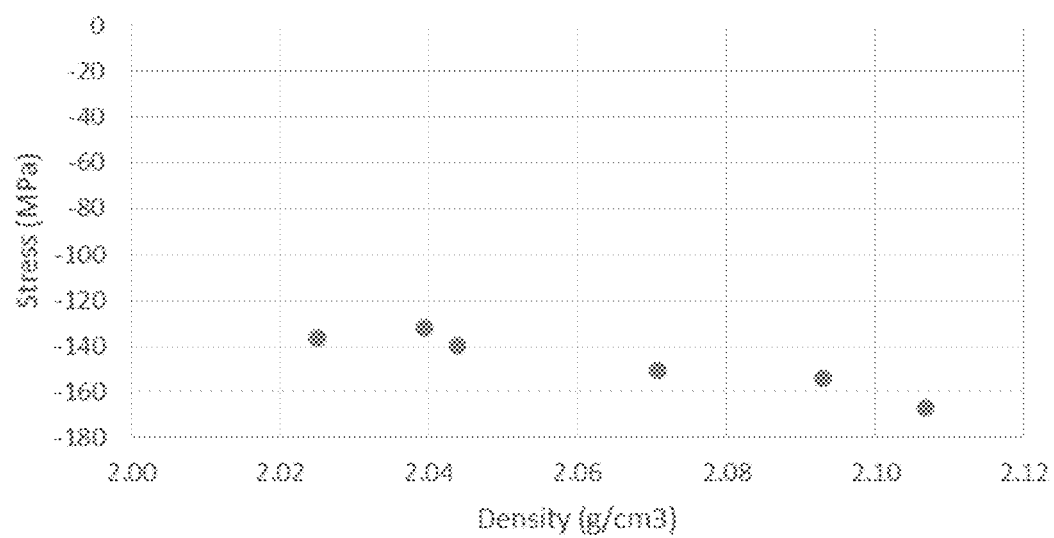
FIG. 2 is an experimental plot of stress versus density for films deposited using low temperature PECVD without post-treatment.

FIG. 2 shows an experimental plot illustrating stress and density for silicon oxide films deposited by conventional PECVD at 180° C. The films were deposited on a 300 mm wafer using a mixture of $SiH_4$, $CO_2$ and He as a process gas. The plasma was formed using high frequency (HF) plasma generation at 13.56 MHz, and the power used for plasma generation varied between 100 W and 400 W for different films. The deposition pressure was varied between 2.5 Torr and 5 Torr for different films, and the composition of the process gas varied in $CO_2/SiH_4$ ratio between 100 and 200 for different films. It can be seen from the plot that all deposited films had compressive stress in excess of 120 MPa in absolute value and the density ranged from about 2.01 to about 2.14 $g/cm^3$. The density and film stress behaved as independent parameters in this study.

A method for dramatically reducing the stress of silicon oxide films to less than about 80 MPa, such as to less than about 50 MPa, or even to less than about 30 MPa has been unexpectedly discovered. The method involves, according to one aspect, treating the silicon oxide that was deposited by low temperature PECVD, with a plasma (such as with helium plasma) to thereby modify the silicon oxide layer and to reduce the stress of the formed layer to less than about 80 MPa in absolute value. In another aspect, the method involves treating the silicon oxide that was deposited by low temperature PECVD, with a UV radiation having a wavelength of less than about 180 nm to thereby modify the silicon oxide layer and reduce the stress of the formed layer to less than about 80 MPa in absolute value.

Methods for Forming Low Stress Silicon Oxide Films

Figure 3A:
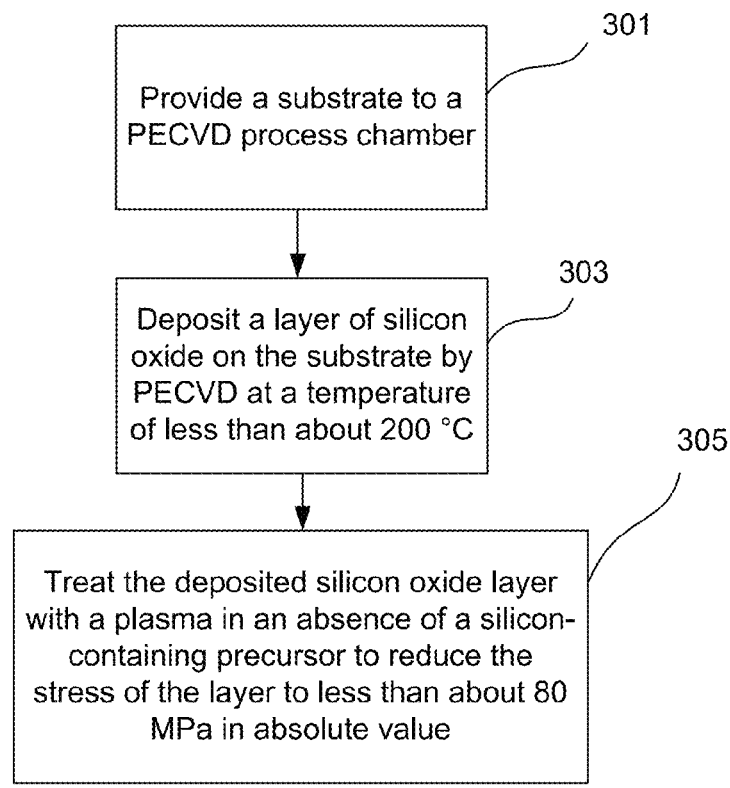
FIGS. 3A-3B present process flow diagrams for silicon oxide formation processes according to embodiments provided herein.
Figure 3B:
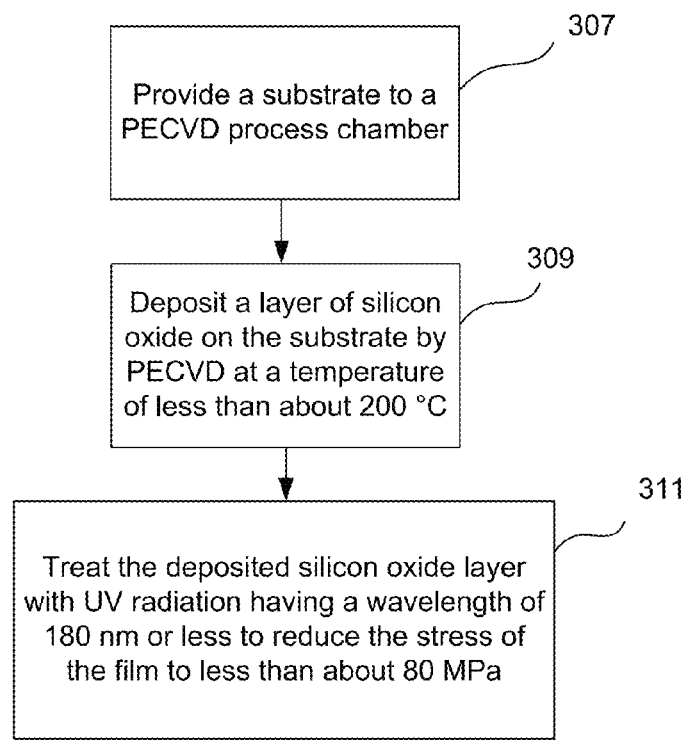

Methods for forming low stress silicon oxide films at low temperature are illustrated in process flow diagrams shown in FIG. 3A and in FIG. 3B. Referring to FIG. 3A, the process starts in 301 by providing a substrate to a PECVD process chamber. The substrate is typically a semiconductor substrate. In some embodiments the substrate is a planar substrate that contains one or more layers of temperature-sensitive materials, as illustrated in FIG. 1A. The PECVD process chamber is configured for conducting reactions in a PECVD mode, and typically includes a support for holding the substrate in place during deposition, one or more inlets for introducing the reactants (such as a silicon-containing precursor, and an oxygen-containing reactant) and an outlet for removing one or more gases from the process chamber. The process chamber, in some embodiments, is equipped with a heater configured to heat the substrate during the deposition. The apparatus that contains the process chamber is configured for generating a plasma in the process chamber and conducting reactions in PECVD mode. The PECVD process chamber may also have the capability of conducting reactions in different modes, but is referred to as a "PECVD process chamber" when it is used to conduct PECVD reactions. For example a plasma enhanced atomic layer deposition (PEALD) process chamber, when used to conduct reactions in PECVD mode, is a "PECVD process chamber" as used herein.

After the substrate has been provided to the PECVD process chamber, in 303, a layer of silicon oxide is deposited by PECVD at a temperature of less than about 200° C. The deposition process involves providing a silicon-containing precursor and an oxygen-containing reactant to the process chamber and forming a plasma in the process chamber. Examples of suitable silicon-containing precursors include carbon-free precursors, e.g., silane ($SiH_4$), disilane ($Si_2H_6$), trisialne ($Si_3H_8$), and dichlorosilane ($SiH_2Cl_2$); and carbon-containing precursors, such as alkoxysilanes, alkylsilanes, cyclic siloxanes, alkynylsilanes, and orthosilicates (e.g., tetraethylorthosilicate). Examples of suitable oxygen-containing reactants include $O_2$, $CO_2$, and $N_2O$. When the silicon-containing precursor includes both silicon and oxygen (e.g., tetraethylorthosilicate), such single precursor may be used both as a silicon source and as an oxygen-containing reactant. The deposition process gas containing the silicon-containing precursor and the oxygen-containing reactant is typically flowed into the process chamber (in some cases with prior vaporization of liquid reactants) together with a diluent gas that is, in some embodiments, an inert gas that is not participating in the PECVD reaction. Examples of diluent gases include $N_2$ and noble gases, such as helium, argon, neon, and krypton.

The temperature is maintained at less than about 200° C. during the deposition process. In some embodiments the deposition temperature is 180° C. or less. For example, films can be deposited at a temperature of between about 100-180° C. The pressure during deposition can vary, and in some embodiments is between about 1-10 torr, more preferably between about 1.5-5 torr, such as about 3.5 torr. The flow rates of individual components of the process gas depend on the size of the process chamber and can be in the range of between about 10-10,000 sccm, in some embodiments. In some embodiments the ratio of the flow rate of an oxygen-containing reactant to the flow rate of the silicon-containing precursor is less than about 300, such as about 200. In one example the ratio of the flow rate of $CO_2$ to the flow rate of $SiH_4$ is less than about 300.

The deposition is performed in some embodiments using only high frequency radio frequency (HF RF) plasma generation (single-frequency deposition). In other embodiments both high frequency and low frequency radio frequency (LF RF) plasma generation are used (dual frequency deposition). HF plasma is generated using frequencies of between about 1.8 MHz and 2.45 GHz, such as at 13.56 MHz. Low frequency plasma is generated using frequencies of between about 50 kHz and 900 kHz, such as 400 kHz. In some embodiments, deposition of silicon oxide is performed using a relatively low power in single frequency HF deposition. For example, the power used for generation of plasma can be in the range of about 100-500 W for deposition on a single 300 mm wafer, corresponding to the power density of between about 0.14 W/cm² to about 0.71 W/cm².

Deposition is performed until a desired amount of silicon oxide is formed on the substrate. In some embodiments a silicon oxide layer having a thickness of about 100-200 Å is deposited in a single step. In other embodiments, a portion of silicon oxide is deposited, and treated, and the process is repeated until a desired thickness of silicon oxide has been achieved.

Silicon oxide films immediately after deposition typically have low quality, and are characterized by relatively high hydrogen content and high stress. The IR spectrum of such films exhibits a prominent Si—H peak at about 2250 cm$^{-1}$, and the stress values are typically in excess of 100 MPa in absolute value (films are compressive).

After these low-quality films have been deposited by low temperature PECVD, in operation 305 the deposited films are treated with a plasma in an absence of the silicon-containing precursor to reduce the stress of deposited films to less than about 80 MPa in absolute value. In some embodiments the flows of the silicon-containing precursor and of the oxygen-containing reactant are stopped after the silicon oxide film has been deposited, and the residual silicon containing precursor is removed from the process chamber by purging and/or evacuation. Next, a plasma treatment process gas, such as helium is provided into the process chamber, and the substrate is treated with a plasma. In some embodiments the plasma treatment is performed in a plasma treatment process gas consisting essentially of helium.

The deposition operation 303 and the treatment operation 305 can be advantageously performed in the same PECVD process chamber. In some embodiments, plasma is not extinguished after the deposition is completed and is maintained throughout the deposition, the purging and the plasma treatment steps. In other embodiments plasma may be extinguished after the deposition has been completed, and then re-ignited during plasma treatment. In yet other embodiments, plasma treatment 305 and silicon oxide deposition 303 are performed in different process chambers, or even in different apparatuses. In one of the preferred embodiments, the plasma treatment is performed shortly after the deposition is completed, such as within about 5 minutes or within 1 minute after deposition has been completed.

In some embodiments (particularly when deposition 303 and treatment 305 are performed in a single chamber without a vacuum break), the plasma treatment process gas (e.g. helium) is the same gas as the diluent gas used during deposition 303, and during purging of the process chamber after 303. In some embodiments the flow rate of the plasma treatment gas (e.g., helium) during plasma treatment is at least 1.5 times, such as at least 2 times greater than the flow rate of the diluent gas during deposition. For example, in some embodiments helium flow rate (as a diluent gas) during deposition 303 is about 1000 sccm, and this flow rate is increased to about 2500 in the plasma treatment step 305, where helium is used as the plasma treatment process gas. Further, the power used for plasma generation is greater during the plasma treatment step 305 than during the deposition step 303. In some embodiments the power used during the plasma treatment step is at least 2 times greater, such as at least 3 times greater than the power used during the deposition step.

The temperature during the plasma treatment step is preferably maintained at less than about 200° C., such as at 100-180° C. The pressure during plasma treatment ranges in some embodiments between about 1-10 torr, such as between about 1-5 torr. In some embodiments the temperature and pressure during the deposition step 303 is the same as the temperature and pressure during the plasma treatment 305. In other embodiments only one of these parameters is kept constant. The use of same pressure and/or temperature during deposition 303 and plasma treatment 305 increases the overall stability of the process.

The duration of the plasma treatment is typically in the range of between about 6 and 20 seconds and is one of parameters that can be changed to tune the stress of the formed silicon oxide layers.

Another aspect of the invention is a method for tuning the stress of silicon oxide to a desired level. The method involves modulating one or more parameters selected from the group consisting of plasma treatment pressure, plasma treatment duration, and power level used in plasma generation during plasma treatment.

Without wishing to be bound by a particular theory of operation, it is suggested that the improvement in stress obtained after helium plasma treatment is observed, at least in part, as a result of interaction between UV radiation formed in a helium plasma and the deposited silicon oxide layer. The UV radiation formed in a helium plasma has wavelength of less than 180 nm. In another aspect of the invention, a method is provided for forming high quality silicon oxide at low temperature using UV radiation having a wavelength of less than about 180 nm. The process flow diagram for this method is presented in FIG. 3B. The steps 307 and 309 are identical to the steps 301 and 303 shown in FIG. 3A. After the silicon oxide layer has been deposited by low temperature PECVD, the silicon oxide layer is treated in 311 with UV radiation having wavelength of less than about 180 nm to reduce the stress of the silicon oxide layer to less than 80 MPa in absolute value. The UV treatment is preferably performed at a temperature of less than 200° C. Suitable sources of UV radiation include sources that utilize excitation (as in a plasma) of H, He, Ar, $O_2$, etc.

Figure 4:
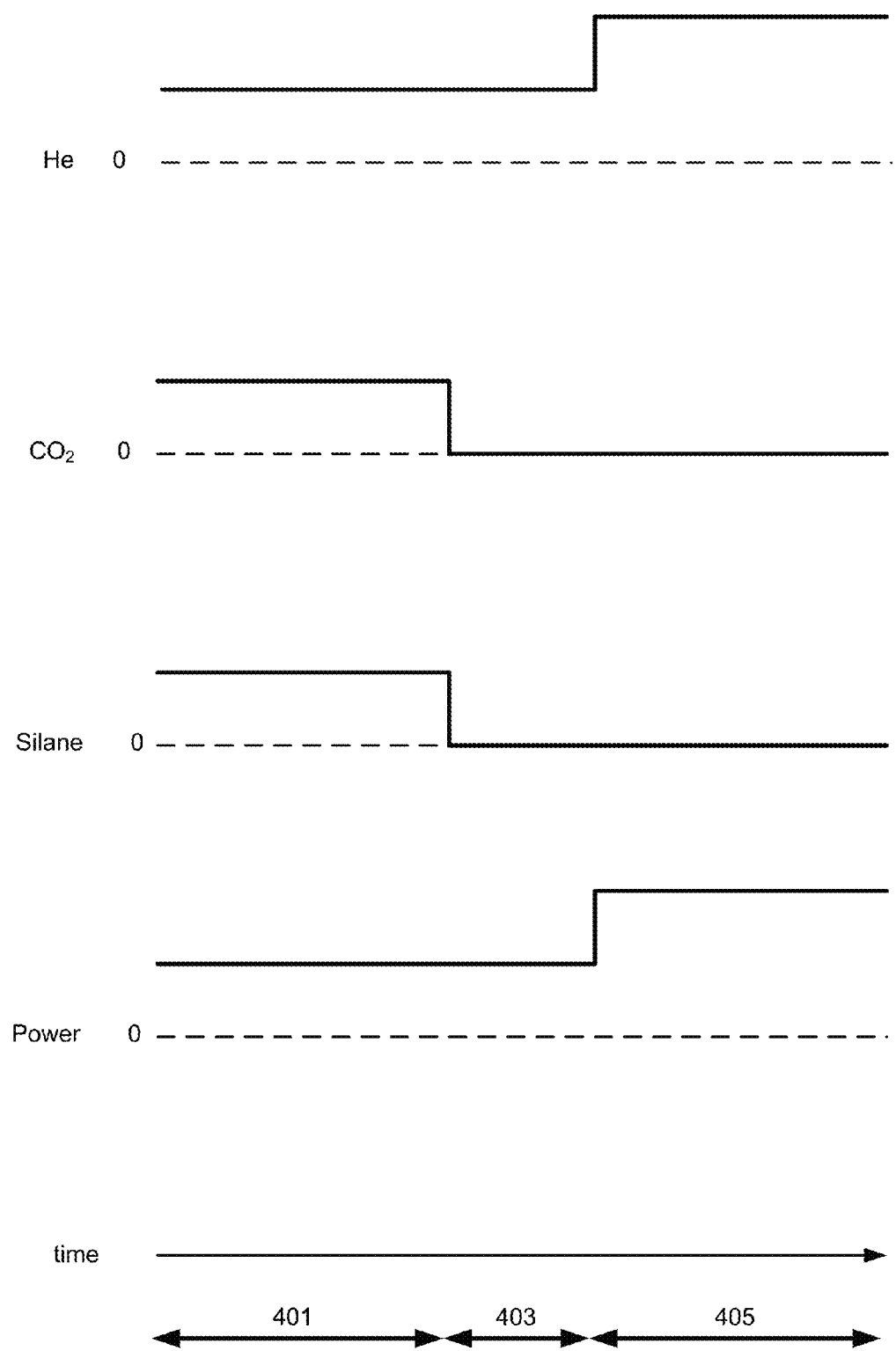
FIG. 4 shows a schematic timing diagram for a silicon oxide formation process, according to some embodiments provided herein.

A specific example of a process that uses helium plasma treatment for reducing stress of a PECVD silicon oxide is illustrated in FIG. 4. FIG. 4 provides a timing diagram that schematically illustrates the flow rates of the components of the process gases, and plasma power levels during the deposition step 401, the purge step 403, and the plasma treatment step 405. It is understood that the diagram is not drawn to scale and provides a general overview of the process. In step 401, the process gas consisting essentially of $SiH_4$, $CO_2$ and He is provided to the process chamber and silicon oxide is deposited using HF RF plasma formed in the process gas using 13.56 MHz frequency and a first power level.

Specific process conditions for the deposition step 401 are provided in Table 1. The parameters are provided for deposition on a single 300 mm wafer substrate and it is understood that plasma power levels and flow rates can be scaled to any desired substrate or a plurality of substrates. For example, when four wafers are processed simultaneously in an apparatus having four processing stations, plasma power and flow rates of gasses should be four times greater than those listed in the Tables 1-3.

TABLE 1

Deposition of silicon oxide on a 300 mm substrate.

| Parameter | Range | Example |
|---|---|---|
| Temperature, ° C. | 100-199° C. | 180° C. |
| Pressure, torr | 1.8-5 Torr | 3.5 Torr |
| HF RF plasma power, W | 100-2000 W | 400 W |
| $SiH_4$ flow rate, sccm | 5-100 sccm | 30 sccm |
| $CO_2$ flow rate, sccm | 1000-10000 sccm | 4200 sccm |
| He flow rate, sccm | 100-10000 sccm | 1250 sccm |
| $CO_2/SiH_4$ flow rate ratio | Less than 300 | 140 |
| Duration, seconds | 1-100 s | 5 s |

Next, in the purge step 403, only helium is flowed into the process chamber and it purges the silane and carbon dioxide out of the process chamber. The plasma is not extinguished during this step, and plasma power is not changed. Table 2 lists the process parameters used during the purging step 403.

TABLE 2

Purging after deposition of silicon oxide on a 300 mm substrate.

| Parameter | Range | Example |
|---|---|---|
| Temperature, ° C. | 100-199° C. | 180° C. |
| Pressure, torr | 1.8-5 Torr | 3.5 Torr |
| HF RF plasma power, W | 100-2000 W | 500 W |
| $SiH_4$ flow rate, sccm | 0 sccm | 0 sccm |
| $CO_2$ flow rate, sccm | 0 sccm | 0 sccm |
| He flow rate, sccm | 100-10000 sccm | 1000 sccm |
| $CO_2/SiH_4$ flow rate ratio | Not applicable | Not applicable |
| Duration, seconds | 0.5-20s | 5s |

After the purge is completed, the deposited silicon oxide film is treated with a helium plasma in step 405. During this step, the plasma power and the helium flow rate are increased. Table 3 lists the process parameters for the plasma treatment step.

TABLE 3

Plasma treatment of silicon oxide on a 300 mm substrate.

| Parameter | Range | Example |
|---|---|---|
| Temperature, ° C. | 100-199° C. | 180° C. |
| Pressure, torr | 1.8-5 Torr | 3.5 Torr |
| HF RF plasma power, W | 500-1200 W | 1000 W |
| $SiH_4$ flow rate, sccm | 0 sccm | 0 sccm |
| $CO_2$ flow rate, sccm | 0 sccm | 0 sccm |
| He flow rate, sccm | 100-10000 sccm | 2500 sccm |
| $CO_2/SiH_4$ flow rate ratio | Not applicable | Not applicable |
| Duration, seconds | 0.5-50 seconds | 6 seconds |

Apparatus

The present invention can be implemented in many different types of apparatus that allow deposition of silicon oxide in PECVD mode. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing the deposition and plasma treatment is transferred from one station to another within the reactor during the process. For example in some implementations, a portion of silicon oxide is deposited on a wafer by PECVD and is plasma treated at a first station of the PECVD apparatus; the wafer is then transferred to a second station of the PECVD apparatus, where an addition portion of silicon oxide is deposited by PECVD and is treated. In one embodiment, formation of a high-quality silicon oxide layer of a desired thickness is deposited in four stations, where each station deposits and treats one fourth of the layer thickness. For example if a 100 Å is the target thickness of the layer, each station deposits and treats 25 Å thick silicon oxide film.

While in process, each wafer is held in place by a pedestal, wafer chuck and/or other wafer holding apparatus. For certain operations in which the wafer is to be heated, the apparatus may include a heater such as a heating plate. In one embodiment of the invention, a PECVD system is used both for deposition and treatment of the layer. When treatment is UV treatment, the source of UV radiation with a wavelength of less than 180 nm can be incorporated into the PECVD apparatus. In other embodiments, separate process chambers or even separate apparatuses may be used for the deposition and treatment steps.

Figure 5:
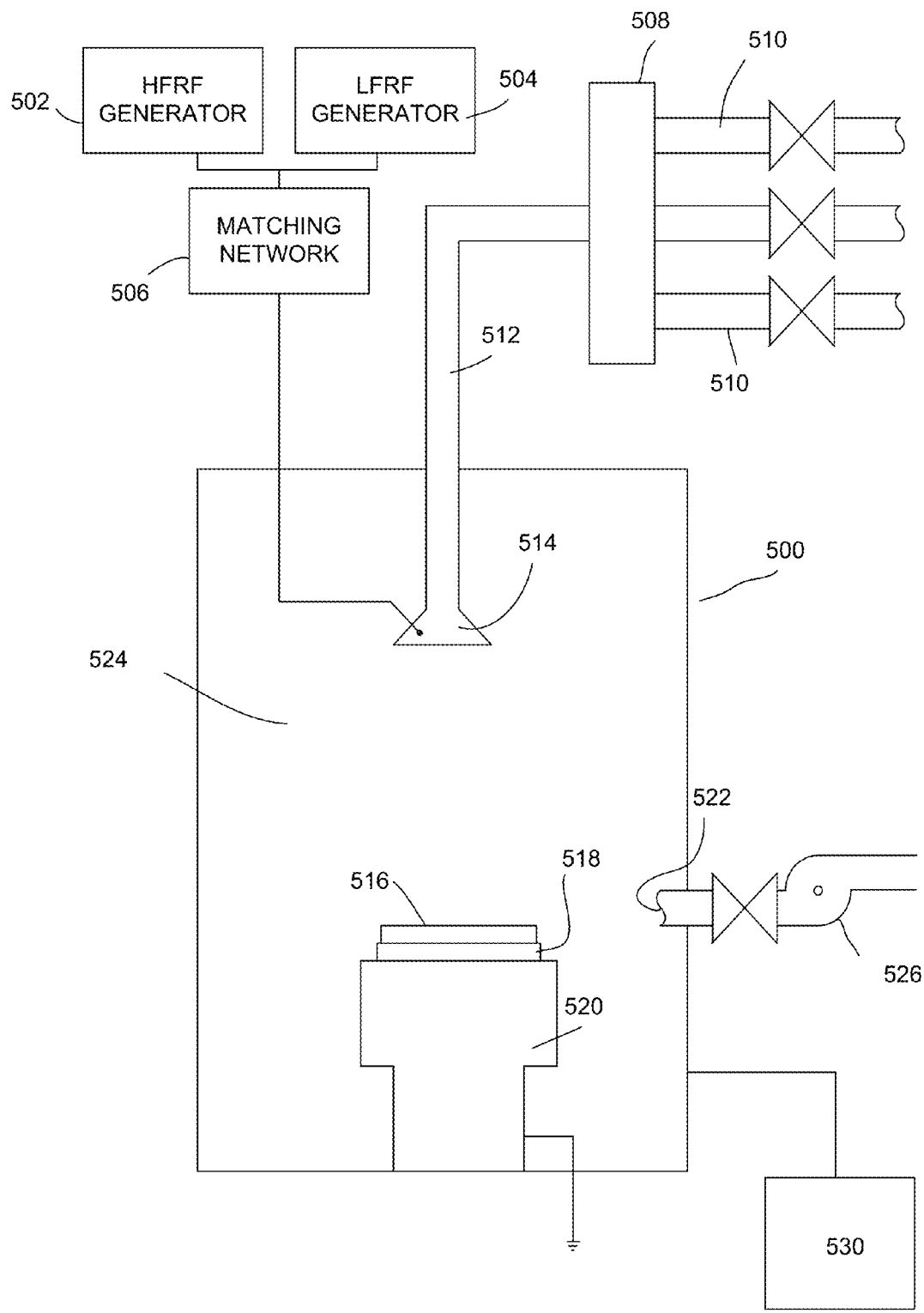
FIG. 5 is a schematic representation of a PECVD apparatus that is suitable for forming silicon oxide films in accordance with some embodiments of the present invention.

FIG. 5 provides a simple block diagram depicting various PECVD reactor components arranged for implementing the present invention. As shown, a reactor 500 includes a process chamber 524, which encloses other components of the reactor and serves to contain the plasma generated by a capacitor type system including a showerhead 514 working in conjunction with a grounded heater block 520. A high-frequency RF generator 502 and an optional low-frequency RF generator 504 are connected to a matching network 506 that, in turn is connected to showerhead 514.

Within the reactor, a wafer pedestal 518 supports a substrate 516. The pedestal typically includes a chuck, a fork, or lift pins to hold and transfer the substrate during and between the deposition reactions. The chuck may be an electrostatic chuck, a mechanical chuck or various other types of chuck as are available for use in the industry and/or research.

The process gases are introduced via inlet 512. Multiple source gas lines 510 are connected to manifold 508. The gases may be premixed or not. Appropriate valving and mass flow control mechanisms are employed to ensure that the correct gases are delivered during the deposition, purging, and plasma treatment, phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 500 via an outlet 522. A vacuum pump 526 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

A controller 530 is associated with the PECVD reactor 500 and can include program instructions for performing any of the processes described herein. For example the controller 530 can specify the necessary parameters for performing deposition of the PECVD silicon oxide at low temperature, for purging the process chamber to remove a silicon-containing precursor, and for plasma treating the deposited silicon oxide layer to reduce the stress of the silicon oxide layer.

Figure 6:
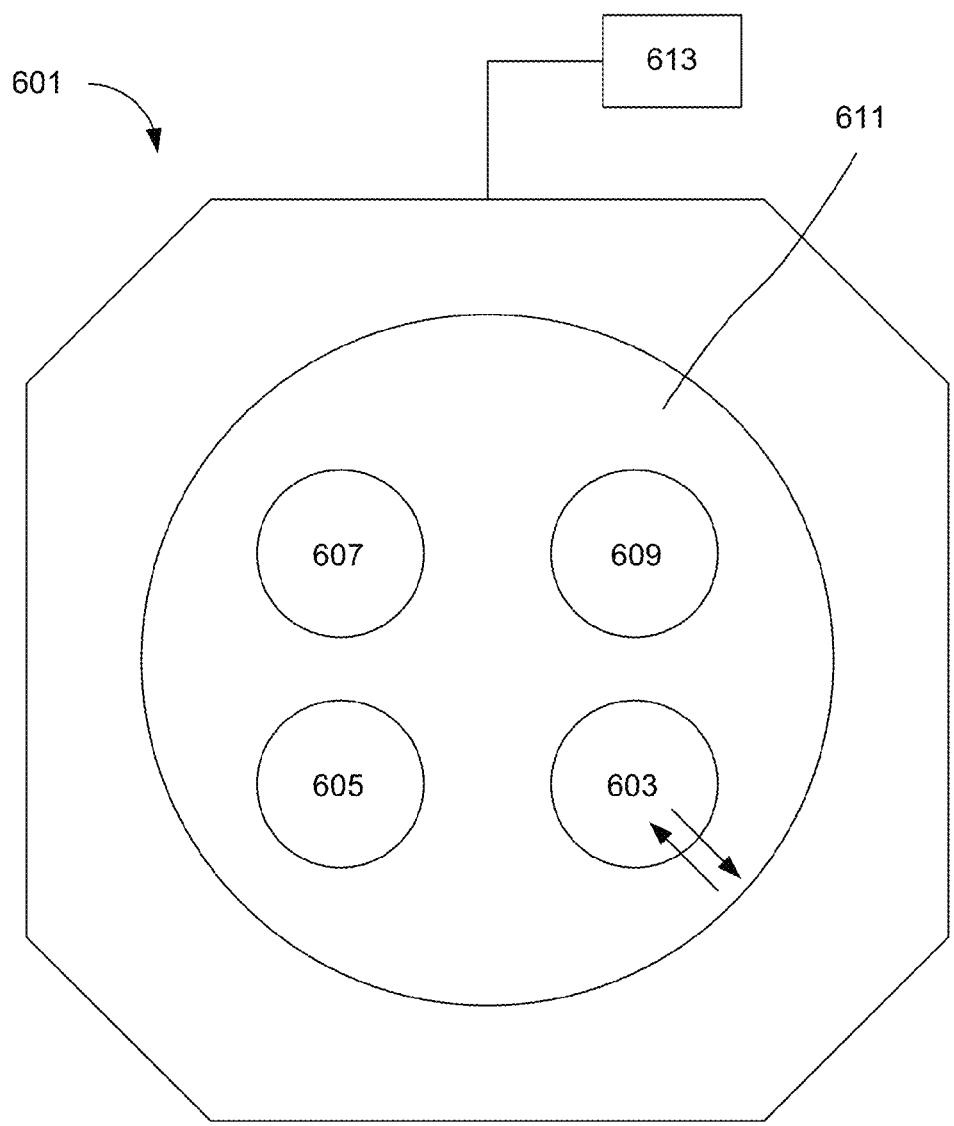
FIG. 6 is a schematic representation of one example of a multi-station apparatus suitable for forming silicon oxide films in accordance with some embodiments of the present invention.

In one of the embodiments a multi-station apparatus may be used for PECVD deposition and treatment. The multi-station reactor allows one to run different processes concurrently in one chamber environment, thereby increasing the efficiency of wafer processing. One example of such an apparatus is depicted in FIG. 6. A schematic presentation of top view is shown. An apparatus chamber 601 comprises four stations 603-609. In general, any number of stations is possible within the single chamber of a multi-station apparatus. Station 603 is used for loading and unloading of the substrate wafers. An indexing plane 611 is used to index wafers from station to station. A controller 613 can comprise instructions for the processes described herein. Stations 603-609 may have the same or different functions. For example, some of the stations may be devoted to PECVD deposition, while others may be used only for plasma treatment of deposited films. In one of the embodiments, individual stations can operate under distinct process conditions and may be substantially isolated from each other. In another implementation, each station is configured to perform PECVD deposition and treatment of the deposited layer.

According to one of the embodiments described above, all stations 603-609 are configured to perform the same function, and each station is configured for both PECVD deposition of silicon oxide and for treatment of deposited layer. An indexing plate 611 is used to lift the substrates off the pedestals and to accurately position the substrates at the next processing station. After the wafer substrate is loaded at station 603, it is indexed to station 605, where formation of the high quality silicon oxide film (including PECVD deposition and treatment) is performed. The wafer is then moved to station 607 where and additional portion of silicon oxide is deposited and treated. The substrate is further indexed to station 609, where further deposition and treatment of silicon oxide is performed, and then indexed to station 603 to deposit and treat more of diffusion silicon oxide layer. For example, each station may deposit and treat 25 Å of silicon oxide to form a 100 Å thick silicon oxide layer, or each station may deposit and treat 50 Å of silicon oxide to form a 200 Å thick silicon oxide layer. The processed wafer is unloaded at station 603, and the module is charged with a new wafer. During normal operation, a separate substrate occupies each station and each time the process is repeated the substrates are moved to new stations. Thus, an apparatus having four stations 603, 605, 607, and 609 allows simultaneous processing of four wafers. This type of processing that involves breaking down the film formation into substantially identical phases, where each phase includes deposition and treatment of a portion of the film, is particularly advantageous because it increases wafer-to wafer reproducibility of deposition.

The process conditions and the process flow itself can be controlled by a controller unit 613 which comprises program instructions for a monitoring, maintaining and/or adjusting certain process variables, such as RF plasma power, gas flow rates and times, temperature, pressure and the like. For example, instructions specifying flow rates of silane and $CO_2$ for silicon oxide deposition may be included. The instructions may specify all of the parameters to perform operations, according to methods described above. For example, instructions may include parameters of PECVD deposition, purging, and plasma treatment. The controller may comprise different or identical instructions for different apparatus stations, thus allowing the apparatus stations to operate either independently or synchronously.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory. Machine-readable media containing instructions for controlling process operations in accordance with the present invention may be coupled to the system controller.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Several embodiments of the described methods and devices will now be illustrated by specific examples.

EXPERIMENTAL EXAMPLES

Example 1. Formation of Silicon Oxide Films Having Low Stress and High Density

Figure 7:
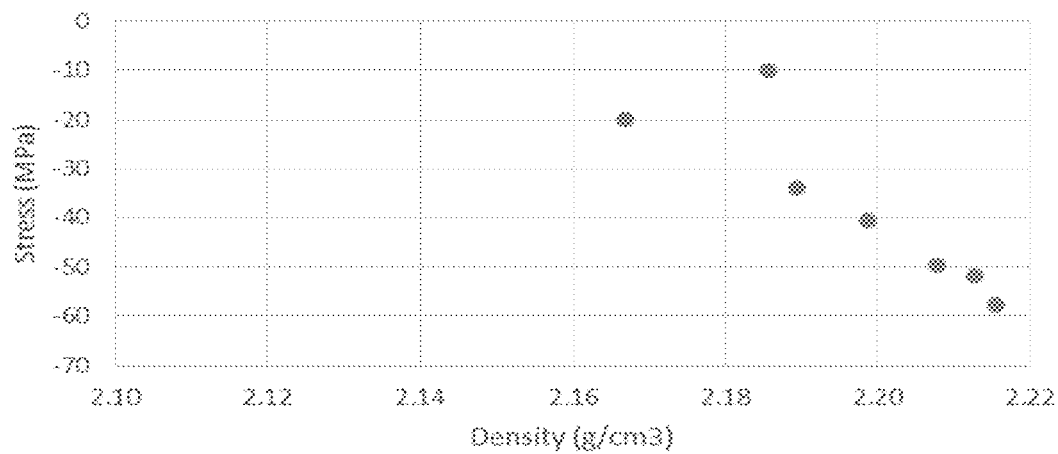
FIG. 7 is an experimental plot of stress versus density for films deposited using low temperature PECVD with post-treatment according to embodiments provided herein.
Figure 8:
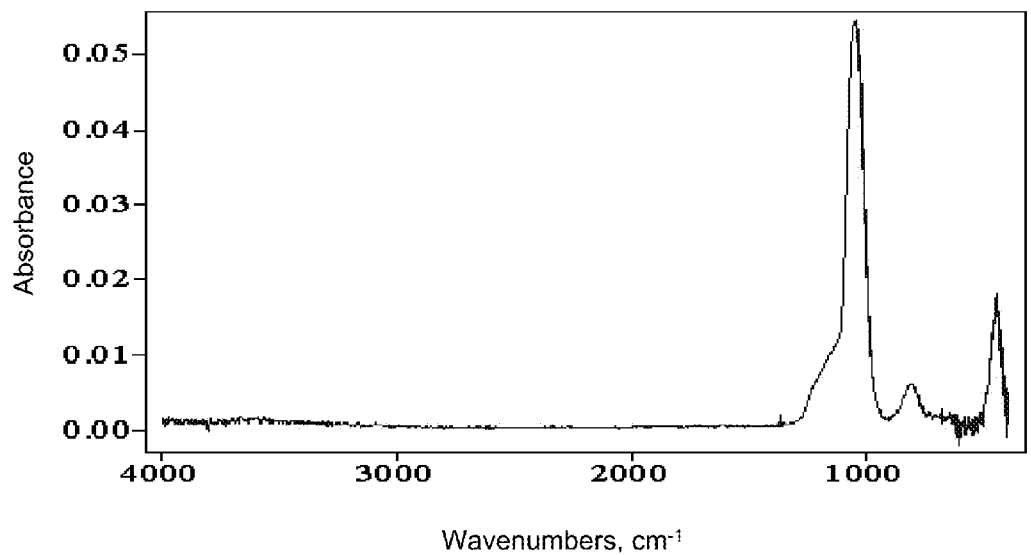
FIG. 8 is an FT IR spectrum of a low-stress silicon oxide film obtained as provided by the embodiments disclosed herein.

A number of silicon oxide films were deposited by PECVD in a Vector PECVD reactor available from Lam Research Corporation, Fremont Calif., on planar 300 mm wafers at a temperature of 180° C., and pressures of 2.5 Torr-3.5 Torr. The process gas used during deposition consisted of $SiH_4$ (provided at 30 sccm), $CO_2$ (provided at 4200 sccm) and He. Plasma was generated in the process gas using HF RF generation at 13.56 MHz at a power level of 100-400 W. The deposition was conducted for 5 seconds;

then the flows of $SiH_4$ and $CO_2$ into the process chamber were stopped, while the plasma and helium flow remained on for 5 seconds to purge the $SiH_4$ and $CO_2$ out of the process chamber. Next, plasma power was increased to 500-1000 W and helium flow was increased to 1000-4000 sccm and the deposited silicon oxide films were plasma treated under these conditions for 6-20 seconds. Temperature and pressure remained constant for each film throughout the process. The flow rates and plasma power levels are given for processing on a single wafer. The films were deposited to a thickness of 400 Å in order to facilitate accurate measurement of stress. After deposition, stress and density of the formed films were measured. Stress was calculated using a measurement of the bow change of the Si wafer substrate and the film thickness ellipsometry. Density was calculated by the change in mass on the Si substrate and the film thickness ellipsometry. The density and stress values of formed films are illustrated in the plot shown in FIG. 7. It can be seen that films with absolute stress values of less than 80 MPa, and even less than 50 MPa were obtained. Some films exhibited stress values of less than 30 MPa. The formed films have densities of greater than 2.05 $g/cm^3$. Some films have densities of greater than 2.1 $g/cm^3$. It can be seen from FIG. 7 that there is a correlation between the density and stress trends, as lower stress (in absolute value) is associated with lower density. Nevertheless, provided methods produce films that have acceptable stress and density values that are suitable for hardmask applications. In contrast, in the absence of plasma treatment, PECVD silicon oxide films that are formed at low temperature had absolute stress values in excess of 100 MPa Example 2. Structure of Formed Low-Stress Films An FT IR spectrum of a low-stress silicon oxide material was obtained. The film was formed as described in Example 1, using the following process parameters: temperature of 180° C., pressure of 3.5 Torr, plasma power of 100 W (generated at 13.56 Mhz), $SiH_4$ flow rate of 30 sccm, $CO_2$ flow rate of 4200 sccm and He flow rate of 1250 sccm. The formed film had a stress of less than −40 MPa. It can be seen that the FT IR spectrum does not have a Si—H peak at about 2250 $cm^{-1}$, which is typically present in silicon oxide films deposited by low temperature PECVD without plasma post-treatment. This indicates that plasma post-treatment reduces the concentration of hydrogen in the formed films.

Example 3. Improvement of Stress, Density, and RI by Plasma Post-Treatment

A comparative silicon oxide film was deposited by low temperature PECVD to a thickness of 411 Å, and its stress, density and RI were measured. The deposition was conducted at a temperature of 180° C., and pressure of 3.5 Torr, using plasma power of 100 W (13.56 Mhz), $SiH_4$ flow rate of 30 sccm, $CO_2$ flow rate of 4200 sccm and He flow rate of 1250 sccm.

Another silicon oxide film was deposited by low temperature PECVD using the same process conditions as those used in the deposition of the comparative film above, and was then plasma treated at a temperature of 180° C., pressure of 3.5 Torr, using plasma power of 500 W (13.56 Mhz), and He flow rate of 1000 sccm. Stress, density, and RI of the treated film were measured.

Parameters for the comparative film and for the treated film are provided in Table 4.

TABLE 4

Improvement of stress, density, and RI upon plasma treatment.

| Parameter | Comparative Film | Treated Film |
| --- | --- | --- |
| Stress (compressive MPa) | 137 | 11 |
| Density (g/cm3) | 2.03 | 2.13 |
| RI (n @ 633 nm) | 1.505 | 1.500 |

It is noted that RI of greater than 1.47 was obtained due to a metrology offset for thin films. RI was measured using ellipsometry.

Example 4. Modulation of Stress Using Pressure in the Treatment Step

Figure 9A:
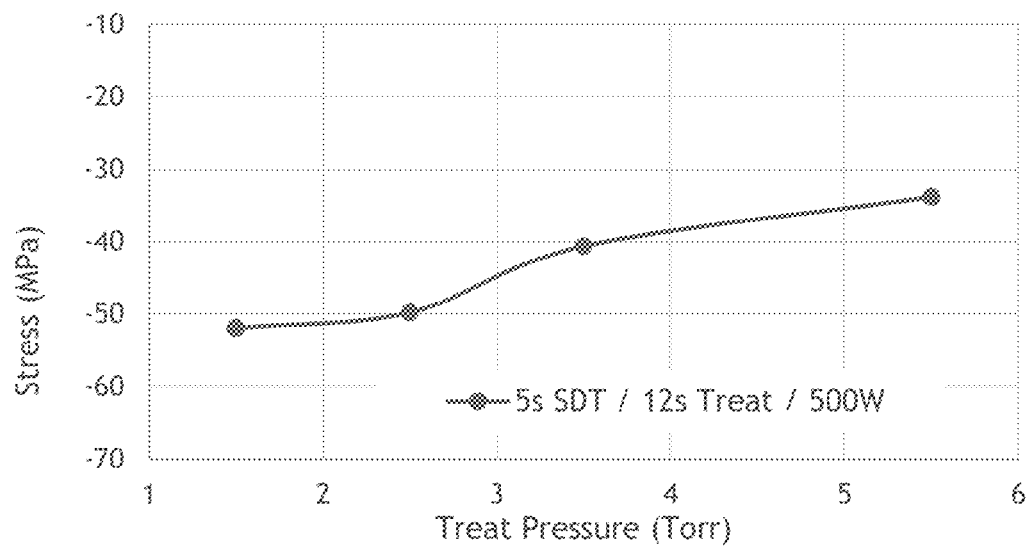
FIG. 9A is an experimental plot illustrating dependence of film stress on the pressure that is used during plasma treatment of silicon oxide films provided herein.

Four films were deposited and treated with helium plasma as described in Example 1. The following conditions were used: temperature of 180° C., plasma power of 100 W (13.56 MHz), $SiH_4$ flow rate of 30 sccm, $CO_2$ flow rate of 4200 sccm and He flow rate of 1250 sccm. The pressure during deposition was constant for all four films and was 3.5 Torr. Pressure during plasma treatment step was varied between 1.5 torr, 2.5 torr, 3.5 torr and 4.5 torr. Treatment pressure was the only process parameter that was varied during film formation. FIG. 9A provides a plot of stress values for the four films as a function of treatment pressure. It can be seen that the absolute value of stress was reduced with the increasing pressure from about 50 Mpa to about 35 MPa.

Example 5. Modulation of Stress Using Plasma Treatment Time

Figure 9B:
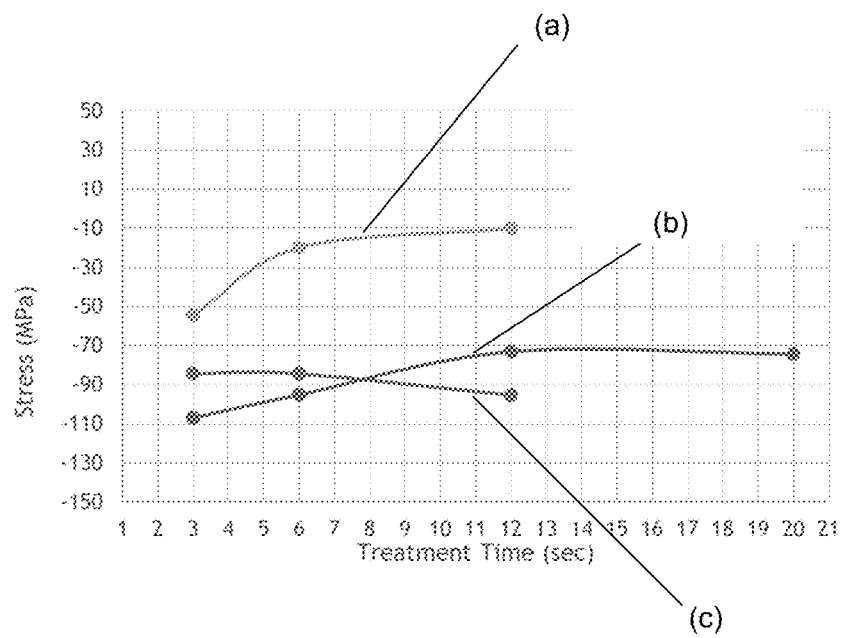
FIG. 9B is an experimental plot illustrating dependence of film stress on the duration of plasma treatment for silicon oxide films provided herein.

Several films having different thicknesses were deposited and plasma treated with helium as described herein. The effect of duration of plasma treatment step on film stress was studied and is shown in FIG. 9B. 50 Å films (curve a) exhibited reduction in stress from about 50 MPa to about 10 MPa in absolute value as duration of treatment was increased from 3 seconds to 12 seconds. 33 Å films (curve b) and 25 Å films (curve c) were somewhat less responsive to changes in treatment duration time.

Figure 9C:
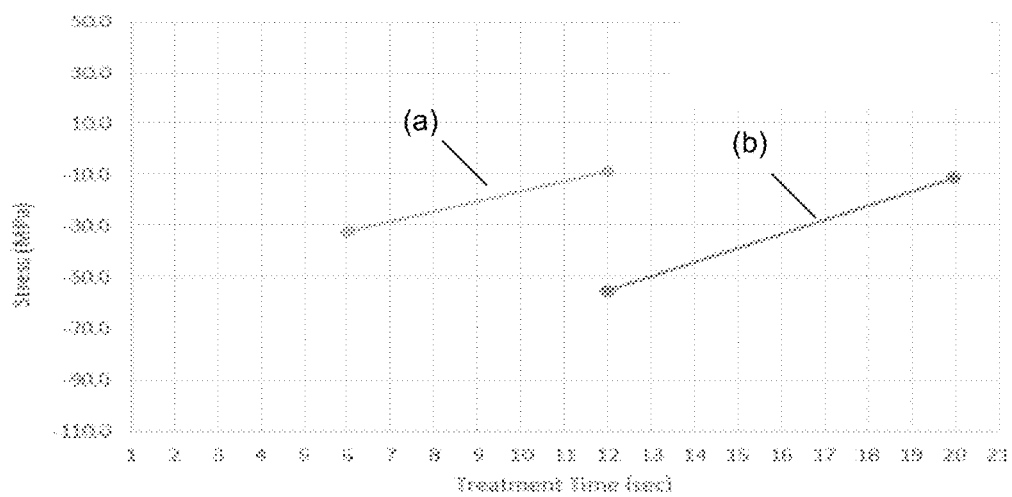
FIG. 9C is an experimental plot illustrating dependence of film stress on the duration of plasma treatment for silicon oxide films of different thicknesses provided herein.

Example 6. Modulation of Stress Using Plasma Treatment Time for Films of Different Thicknesses Several films having different thicknesses were deposited and plasma treated with helium as described herein. The effect of duration of plasma treatment step on film stress was studied and is shown in FIG. 9C. 50 Å films (curve a) treated using 500 W plasma power exhibited a decrease in absolute stress as duration of treatment was increased from 6 seconds to 12 seconds. Films having 100 Å thickness (curve b) treated using 500 W plasma power also exhibited a decrease in stress as duration of treatment was increased from 12 seconds to 20 seconds.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method for processing a semiconductor substrate, the method comprising:
   (a) providing a semiconductor substrate to a PECVD process chamber;

(b) depositing a layer of silicon oxide on the semiconductor substrate by PECVD at a temperature of less than about 200° C., wherein the depositing comprises flowing a silicon-containing precursor and an oxygen-containing reactant into the PECVD process chamber and forming a plasma;

(c) stopping flow of the silicon-containing precursor after deposition; and (d) treating the deposited layer of silicon oxide with a plasma at a temperature of less than about 200° C. to thereby modify the deposited layer and to reduce the stress of the deposited layer to an absolute value of less than about 80 MPa.

2. The method of claim 1, wherein the method comprises increasing power that is used for plasma generation from a first power level used in (b) to a second, greater power level used in (d).

3. The method of claim 1, wherein (d) comprises treating the deposited layer of silicon oxide with a plasma formed in a process gas consisting essentially of helium.

4. The method of claim 1, wherein the semiconductor substrate provided in (a) comprises one or more layers of temperature-sensitive material that is sensitive to temperatures of 250° C. and higher.

5. The method of claim 4, wherein the temperature-sensitive material is an organic material.

6. The method of claim 4, wherein the temperature-sensitive material is a spin-on dielectric.

7. The method of claim 1, wherein the deposition of the layer of silicon oxide is performed at a temperature of less than about 180° C.

8. The method of claim 1, wherein the absolute value of stress of the silicon oxide layer obtained after (d) is less than about 50 MPa.

9. The method of claim 1, wherein the absolute value of stress of the silicon oxide layer obtained after (d) is less than about 10 MPa.

10. The method of claim 1, wherein the plasma treatment of the layer of silicon oxide in (d) reduces the content of hydrogen in the layer of silicon oxide.

11. The method of claim 1, wherein the silicon oxide obtained after plasma treatment in (d) does not have a Si—H peak at 2200-2300 $cm^{-1}$ on an IR spectrum.

12. The method of claim 1, wherein the method comprises maintaining the plasma after (b) and before (c).

13. The method of claim 1, further comprising purging the PECVD process chamber after (b) and before (d) to remove the silicon-containing precursor from the process chamber.

14. The method of claim 1, wherein (b) further comprises flowing an inert gas into the PECVD process chamber.

15. The method of claim 14, wherein the silicon-containing precursor is $SiH_4$, the oxygen-containing reactant is $CO_2$ and the inert gas is He.

16. The method of claim 1, wherein (b) is performed at a pressure of between about 1.5-5 Torr.

17. The method of claim 1, wherein (b) and (d) are performed in the same PECVD process chamber at substantially the same pressure and temperature.

18. The method of claim 1, wherein (b)-(d) are performed at a first station of a multi-station PECVD apparatus, wherein the method further comprises transferring the semiconductor substrate to a second station of a multi-station PECVD apparatus after (d), and repeating (b)-(d) in the second station of the multi-station PECVD apparatus.

19. The method of claim 1, further comprising:
applying photoresist to the semiconductor substrate;
exposing the photoresist to light;
patterning the photoresist and transferring the pattern to the semiconductor substrate; and
selectively removing the photoresist from the semiconductor substrate.

20. A method for processing a semiconductor substrate, the method comprising:
(a) providing a semiconductor substrate to a PECVD process chamber;
(b) depositing a layer of silicon oxide on the semiconductor substrate by PECVD at a temperature of less than about 200° C.;
(c) stopping flow of the silicon-containing precursor after deposition; and
(d) treating the deposited layer of silicon oxide with UV light having a wavelength of 180 nm or less at a temperature of less than about 200° C. to modify the deposited layer and to reduce the stress of the deposited layer to an absolute value of less than about 80 MPa.

* * * * *